United States Patent
Balakrishnan et al.

(10) Patent No.: US 9,773,913 B1
(45) Date of Patent: Sep. 26, 2017

(54) VERTICAL FIELD EFFECT TRANSISTOR WITH WRAP AROUND METALLIC BOTTOM CONTACT TO IMPROVE CONTACT RESISTANCE

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/148,341

(22) Filed: May 6, 2016

(51) Int. Cl.
  *H01L 29/78* (2006.01)
  *H01L 29/786* (2006.01)
  *H01L 29/423* (2006.01)
  *H01L 29/66* (2006.01)
  *H01L 21/285* (2006.01)

(52) U.S. Cl.
  CPC .. *H01L 29/78618* (2013.01); *H01L 21/28518* (2013.01); *H01L 29/42392* (2013.01); *H01L 29/665* (2013.01); *H01L 29/66666* (2013.01); *H01L 29/78642* (2013.01); *H01L 29/78696* (2013.01)

(58) Field of Classification Search
  None
  See application file for complete search history.

(56) References Cited

U.S. PATENT DOCUMENTS

| 9,385,185 | B2* | 7/2016 | Chang | H01L 29/0657 |
| 2013/0095623 | A1* | 4/2013 | Guo | H01L 29/4983 438/268 |
| 2016/0181362 | A1* | 6/2016 | Yang | H01L 29/0649 257/329 |

OTHER PUBLICATIONS

List of IBM Patents or Patent Applications Treated as Related.

* cited by examiner

Primary Examiner — Charles Garber
Assistant Examiner — Alia Sabur
(74) Attorney, Agent, or Firm — Louis J. Percello; Ryan, Mason & Lewis, LLP

(57) ABSTRACT

Semiconductor devices having vertical field effect transistor (FET) devices with reduced contact resistance are provided, as well as methods for fabricating vertical FET devices with reduced contact resistance. For example, a semiconductor device includes a vertical FET device formed on a substrate. The vertical FET comprises a lower source/drain region disposed on the substrate. The lower source/drain region comprises an upper surface, sidewall surfaces, and a bottom surface, wherein the bottom surface of the lower source/drain region contacts the substrate. A lower metallic contact is disposed adjacent to, and in contact with, at least one sidewall surface of the lower source/drain region, wherein the lower metallic contact comprises a laterally extended portion which laterally extends from the at least one sidewall surface of the lower source/drain region. A vertical source/drain contact is disposed adjacent to the vertical FET device and contacts the laterally extended portion of the lower metallic contact.

20 Claims, 28 Drawing Sheets

100

US 9,773,913 B1

VERTICAL FIELD EFFECT TRANSISTOR WITH WRAP AROUND METALLIC BOTTOM CONTACT TO IMPROVE CONTACT RESISTANCE

TECHNICAL FIELD

This disclosure relates generally to semiconductor fabrication techniques and, in particular, to structures and methods for fabricating vertical FET (field effect transistor) devices.

BACKGROUND

Traditional CMOS (complementary metal oxide semiconductor) techniques include process flows for constructing planar FET devices. With planar FETs, increased transistor density can be achieved by decreasing the pitch between transistor gate elements. However, with planar FET devices, the ability to decrease gate pitch is limited by the required gate length, spacer thickness, and source/drain size. In recent years, there has been significant research and development with regard to vertical FET devices, which decouple the gate length from the gate pitch requirement and enable scaling of transistor density. In general, vertical FET devices are designed to have gate structures that are formed on multiple sides of a vertical channel structure (e.g., a vertical semiconductor fin or vertical nanowire). With vertical FET devices, scaling is determined by how closely conductive contacts to source and drain regions can be placed.

In general, vertical FET devices employ doped source and drain regions, wherein a doped source region for a vertical FET can be formed on top of a vertical semiconductor fin, and wherein a doped drain region can be formed underneath the vertical semiconductor fin. In addition, a vertical drain contact of the vertical FET device is disposed adjacent to the vertical semiconductor fin as an elongated bar contact. The vertical drain contact is formed to make contact to an upper surface of the underlying drain region, and is disposed at a sufficient distance from the vertical semiconductor fin so that the vertical drain contact does not electrically short to the vertical metal gate structure formed on the vertical semiconductor fin. What this effectively means is that the current path through the doped drain region between a vertical contact/drain region interface and a drain region/channel junction interface, is comprised entirely of doped semiconductor material. This current path through the doped drain region, if relatively long, can result in increased series resistance of the drain, which in turn reduces a total drive current of the vertical FET device.

SUMMARY

Embodiments of the invention generally include semiconductor devices having vertical FET devices with reduced contact resistance, as well as methods for fabricating vertical FET devices with reduced contact resistance. For example, one embodiment of the invention includes a semiconductor device which comprises a vertical field effect transistor (FET) device formed on a substrate. The vertical FET device comprises a lower source/drain region disposed on the substrate. The lower source/drain region comprises an upper surface, sidewall surfaces, and a bottom surface, wherein the bottom surface of the lower source/drain region contacts the substrate. A lower metallic contact is disposed adjacent to, and in contact with, at least one sidewall surface of the lower source/drain region, wherein the lower metallic contact comprises a laterally extended portion which laterally extends from the at least one sidewall surface of the lower source/drain region. A vertical source/drain contact is disposed adjacent to the vertical FET device and contacts the laterally extended portion of the lower metallic contact.

Other embodiments will be described in the following detailed description of embodiments, which is to be read in conjunction with the accompanying figures.

BRIEF DESCRIPTION OF THE DRAWINGS

FIGS. 2 through 26 schematically illustrate a method for fabricating the semiconductor structure of FIGS. 1A/1B, according to an embodiment of the invention, wherein:

FIG. 2 is a cross-sectional view of a semiconductor structure at an initial stage of fabrication starting with a stack of layers sequentially formed on a semiconductor substrate;

FIG. 3 is a schematic cross-sectional view of the semiconductor structure of FIG. 2 after etching a trench opening through the stack down to a first spacer layer;

FIG. 4 is a schematic cross-sectional view of the semiconductor structure of FIG. 3 after forming a thin layer of oxide on exposed sidewalls surfaces of a dummy gate layer within the trench opening;

FIG. 5 is a schematic cross-sectional view of the semiconductor structure of FIG. 4 after etching an exposed portion of the first spacer layer at the bottom of the trench opening down;

FIG. 6 is a schematic cross-sectional view of the semiconductor structure of FIG. 5 after forming a vertical semiconductor fin in the trench opening;

FIG. 7 is schematic cross-sectional view of the semiconductor structure of FIG. 6 after recessing an upper portion of the vertical semiconductor fin down below a planarized surface of an insulating layer, and filling the upper portion of the trench opening with a capping layer;

FIG. 8 is schematic cross-sectional view of the semiconductor structure of FIG. 7 after etching away the insulating layer down to a second spacer layer, forming a thinned vertical fin structure, and epitaxially growing an upper source/drain region on the thinned vertical fin structure;

FIG. 9 is a schematic cross-sectional side view of the semiconductor structure of FIG. 8 after forming an encapsulation structure that encapsulates the upper source/drain region;

FIG. 10 is a schematic cross-sectional side view of the semiconductor structure of FIG. 9 after vertically etching the stack of layers on the substrate down to a counter-doped semiconductor layer to form upper and lower spacers, dummy gate structures, and a lower source/drain region;

FIG. 11 is a schematic cross-sectional side view of the semiconductor structure of FIG. 10 after depositing a layer of oxide material which is used to form an insulating spacer on the counter doped semiconductor layer;

FIG. 12 is a schematic cross-sectional side view of the semiconductor structure of FIG. 11 after performing an oxide recess process to form the insulating spacer on the counter-doped semiconductor layer;

FIG. 13 is a schematic cross-sectional side view of the semiconductor structure of FIG. 12 after forming angled notches on the exposed sidewalls of the lower source/drain region;

FIG. 14 is a schematic cross-sectional side view of the semiconductor structure of FIG. 13 after forming metal-semiconductor alloy layers on the angled surfaces of the notches;

FIG. 15 is a schematic cross-sectional side view of the semiconductor structure of FIG. 14 after blanket depositing and planarizing a layer of conductive material that is used to form a lower metallic contact which wraps around the sidewalls of the lower source/drain region;

FIG. 16 is a schematic cross-sectional side view of the semiconductor structure of FIG. 15 after recessing the layer of conductive material to form the lower metallic contact which wraps around the sidewalls of the lower source/drain region;

FIG. 17 is a schematic cross-sectional side view of the semiconductor structure of FIG. 16 after blanket depositing and planarizing a layer of dielectric material that is used to form a dielectric spacer on the lower metallic contact;

FIG. 18 is a schematic cross-sectional side view of the semiconductor structure of FIG. 17 after recessing layer of dielectric material to form the dielectric spacer on the lower metallic contact;

FIG. 19 is a schematic cross-sectional side view of the semiconductor structure of FIG. 18 after sequentially removing the dummy gate structure and the oxide layer to expose the sidewall surfaces of the vertical semiconductor fin;

FIG. 20 is a schematic cross-sectional side view of the semiconductor structure of FIG. 19 after sequentially depositing a thin conformal layer of gate dielectric material and a thin conformal layer of metallic gate material (e.g., work function metal);

FIG. 21 is a schematic cross-sectional side view of the semiconductor structure of FIG. 20 after depositing and planarizing a layer of gate electrode material which is subsequently patterned to form a gate electrode;

FIG. 22 is a schematic cross-sectional side view of the semiconductor structure of FIG. 21 after recessing the layer of gate electrode material down to a target level;

FIG. 23 is a schematic cross-sectional side view of the semiconductor structure of FIG. 22 after removing portions of the conformal layer of gate dielectric material and the conformal layer of metallic gate material which are exposed after recessing the gate electrode material layer;

FIG. 24 is a schematic cross-sectional side view of the semiconductor structure of FIG. 23 after patterning the recessed layer of gate electrode material and remaining portions of the gate dielectric material layer and the metallic gate material layer, to form the gate electrode and a high-k metal gate structure on the sidewalls of the vertical semiconductor fin;

FIG. 25 is a schematic cross-sectional side view of the semiconductor structure of FIG. 24 after depositing and planarizing a layer of dielectric material to form an ILD (interlayer dielectric) layer; and FIG. 26 is a schematic cross-sectional side view of the semiconductor structure of FIG. 25 after etching a pattern of contact openings which are subsequently filled with conductive material to form vertical source, drain and gate contacts as shown in FIGS. 1A and 1B.

DETAILED DESCRIPTION OF EMBODIMENTS

Embodiments of the invention will now be described in further detail with regard to semiconductor devices having vertical FET devices with reduced contact resistance, as well as methods for fabricating vertical FET devices with reduced contact resistance. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Figure 1A:
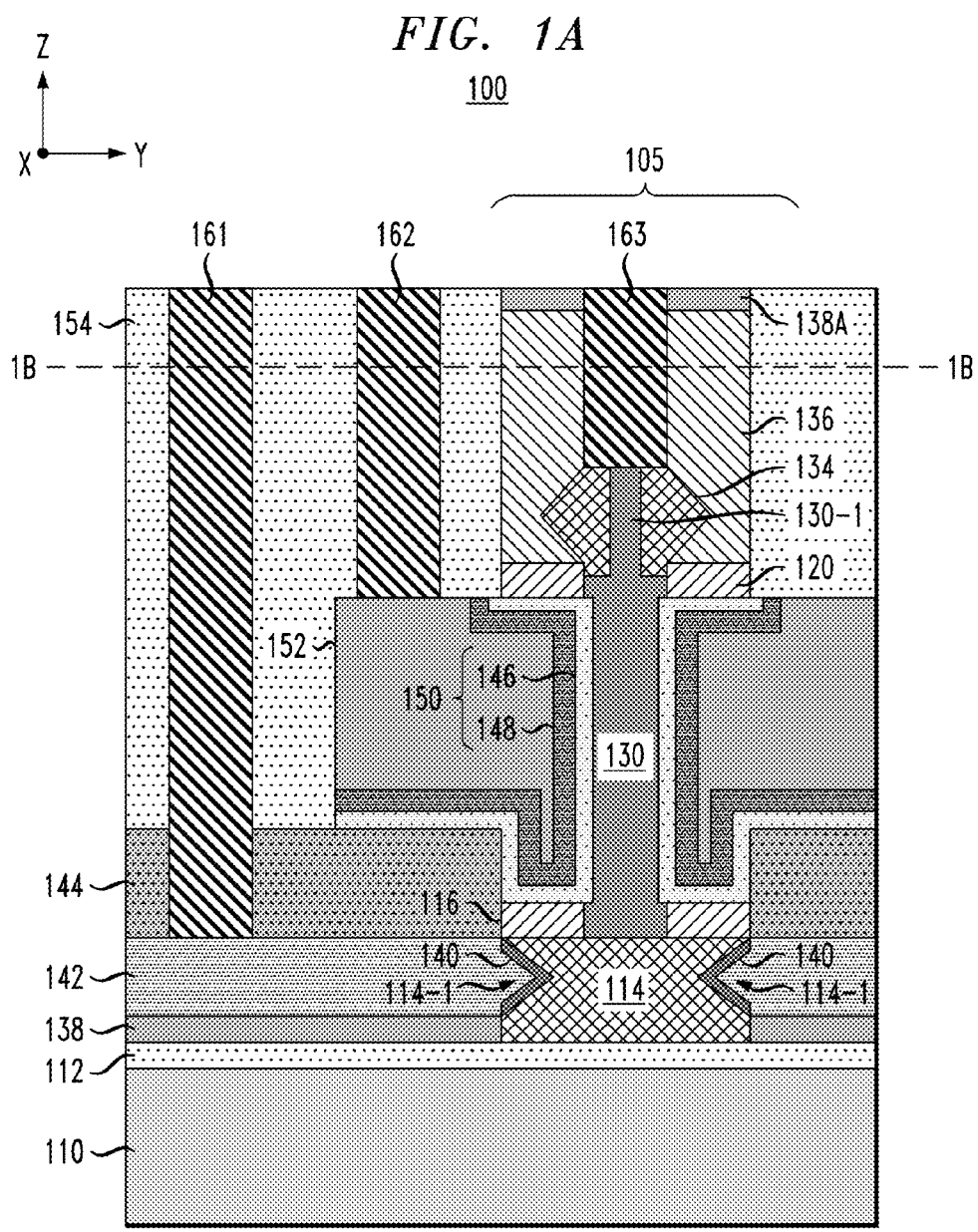
FIGS. 1A and 1B are schematic views of a semiconductor structure comprising a vertical FET device, according to an embodiment of the invention.
Figure 1B:
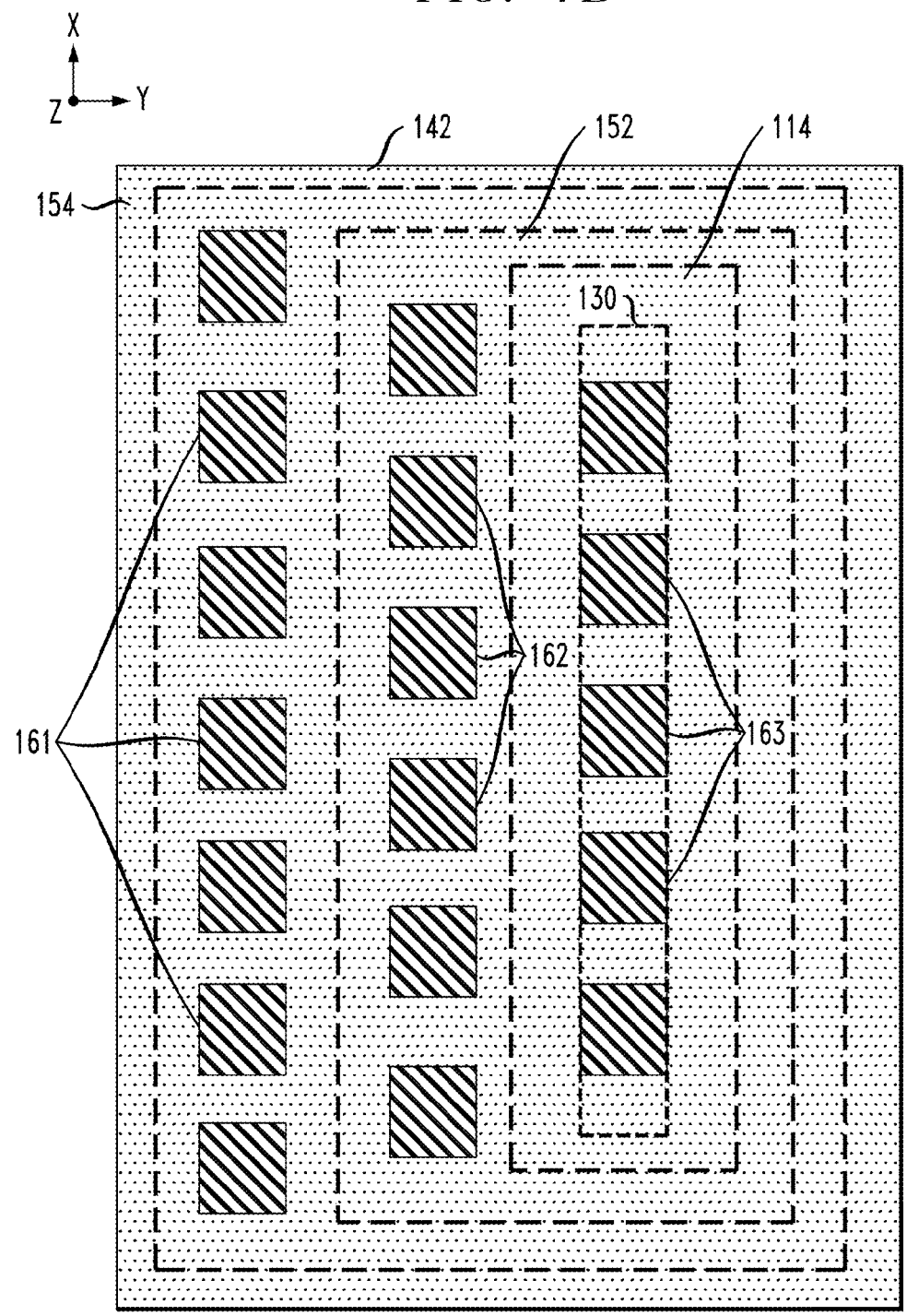

FIGS. 1A and 1B are schematic views of a semiconductor structure 100 comprising a vertical FET device, according to an embodiment of the invention. In particular, FIG. 1A is a schematic cross-sectional view of the semiconductor structure 100 in an Y-Z plane, as indicated by the XYZ Cartesian coordinates shown in FIG. 1A. In addition, FIG. 1B is a top plan view of the semiconductor structure 100 at line 1B-1B in FIG. 1A in an X-Y plane as indicated by the XYZ Cartesian coordinates shown in FIG. 1B. It is to be understood that the terms "vertical" or "vertical direction" as used herein denotes a Z-direction of the Cartesian coordinates shown in FIGS. 1A/1B, and that the terms "horizontal" or "horizontal direction" or "lateral" or "laterally extending" as used herein denotes an X-direction and/or Y-direction of the Cartesian coordinates shown in FIGS. 1A/1B, which is perpendicular to the Z-direction.

As shown in FIG. 1A, the semiconductor structure 100 comprises vertical FET device 105 formed on a substrate 110/112, wherein the substrate comprises bulk substrate layer 110 and a counter-doped semiconductor layer 112. The vertical FET device 105 comprises a lower source drain region 114, a lower spacer 116, a vertical semiconductor fin 130 (vertical device channel), an upper spacer 120, and an upper source/drain region 134 formed on a thinned upper portion 130-1 of the vertical semiconductor fin 130. The vertical semiconductor fin 130 serves as a vertical channel region of the vertical FET device 105, which connects the lower source/drain region 114 and the upper source/drain region 134. In one embodiment of the invention, the lower and upper source/drain regions 114 and 134 are formed of doped epitaxial semiconductor materials. It is to be understood that the term "source/drain region" as used herein means that a given source/drain region can be either a source region or a drain region, depending on the application. For example, in one embodiment, the lower source/drain region 114 comprises a source region, while the upper source/drain region 134 comprises a drain region.

The vertical FET device further comprises a high-k metal gate stack structure 150 which comprise a gate dielectric layer 146 and a metallic gate layer 148 (e.g., work function metal layer), wherein the high-k metal gate stack structure 150 is formed on and around the vertical sidewalls of the vertical semiconductor fin 130. In addition, a gate electrode 152 is formed in contact with the high-k metal gate stack structure 150 and surrounds the sidewalls of the vertical semiconductor fin 130. The lower spacer 116 electrically insulates the lower source/drain region 114 from the metallic layers 148 and 152, and the upper spacer 120 electrically insulates the upper source/drain region 134 from the metallic layers 148 and 152. The upper source/drain region 134 is protected by an encapsulation structure 136.

The semiconductor structure 100 further comprises a first spacer 138, a lower metallic contact 142, a second spacer 144, an ILD (interlayer dielectric) layer 154, and a plurality of vertical contacts 161, 162 and 163. The first spacer 138 electrically insulates the lower metallic contact 142 from the counter-doped semiconductor layer 112. The second spacer 144 electrically insulates the lower metallic contact 142 from the gate electrode 152 and the metallic gate layer 148. The vertical contact 161 is formed through the ILD layer 152 and the second spacer 144 to contact the lower metallic contact 142. The vertical contact 162 is formed through the ILD layer 154 to contact the gate electrode 152. The vertical contact 163 is formed through the encapsulation structure 136 to contact the upper source/drain region 134.

In the example embodiment of FIGS. 1A/1B, the vertical contact 161 and the lower metallic contact 142 (which, in one embodiment, wraps around the sidewalls of the lower source/drain region 114) provide a low-resistance electrical connection to the lower source/drain region 114. Furthermore, as shown in FIG. 1A, the lower source/drain region 114 comprises notches 114-1 that are etched in the sidewalls of the lower source/drain region 114, providing angled surfaces on which metal-semiconductor alloy layers 140 on formed (e.g., silicide layers). This structural configuration achieves a reduced contact resistance to the lower source/drain region 114 of the vertical FET device 105, as compared to conventional designs.

Indeed, with conventional designs, the lower source/drain region 114 would be formed with a large footprint area that horizontally extends past the sides of the vertical FET device 105 to enable the vertical contact 161 to land on (make contact to) an upper surface of a peripheral region of the lower source/drain region 114. In such instance, since the lower source/drain region 114 is comprised entirely of doped semiconductor material, the large footprint area of the lower source/drain region (in a conventional design) would provide a higher-resistance current path through the doped semiconductor material (of the lower source/drain region) between the vertical contact 161 and the vertical semiconductor fin 130 (vertical channel). In contrast to a conventional design, the embodiment shown in FIGS. 1A and 1B maintains a smaller footprint area for the lower source/drain region 114 and utilizes the lower metallic contact 142 (wrap around contact) to provide a horizontally/laterally extending metallic contact between the vertical contact 161 and the lower source/drain region 114. Since the lower metallic contact 142 is formed a conductive material that has lower electrical resistance than the doped semiconductor material used to form the lower source/drain region 114, the lower metallic contact 142 provides a low-resistance current path from the vertical contact 161 to the smaller footprint lower source/drain region 114.

For example, FIG. 1B is a top plan view of FIG. 1A which schematically illustrates (via dashed outlines) example embodiments of the footprint areas of the vertical semiconductor fin 130, the lower source/drain region 114, the gate electrode 152, and the lower metallic contact 142. In addition, FIG. 1B shows an example layout/arrangement of a plurality of the vertical contacts 161, 162, and 163 which are formed to contact the lower metallic contact 142, the gate electrode 152, and the vertical semiconductor fin 130, respectively. As shown in the example embodiment of FIG. 1B, the lower source/drain region 114 has a small footprint size, and is formed with a minimal surface area to accommodate the vertical semiconductor fin 130. As further shown in FIG. 1B, the lower metallic contact 142 has a footprint area which surrounds (and makes contact to) all sides of the lower source/drain region 114. The lower metallic contact 142 is formed with a sufficient footprint area to enable the array of vertical contacts 161 to make contact to an upper surface of a peripheral region of the lower metallic contact 142.

In this regard, the lower metallic contact 142 essentially serves as a low-resistance lateral extension of the lower source/drain region 114 to provide reduced contact resistance. As noted above, this is in contrast to conventional designs in which the lower source/drain region 114 would be formed with a footprint area similar to the footprint area of the lower metallic contact 142 shown in FIG. 1B to enable the array of vertical contacts 161 to make contact to an upper surface of the peripheral region of the lower source/drain region 114.

Moreover, in the configuration shown in FIG. 1A, a further reduction in contact resistance is realized by implementing the etched notches 114-1 in the sidewalls of the lower source/drain region 114. Indeed, the etched notches 114-1 (with the metal-semiconductor alloy layers 140) serve to increase the contact surface area (i.e., the interface area) between the lower metallic contact 142 and the sides of the lower source/drain region 114, while the metal-semiconductor alloy layers 140 serve to provide an ohmic contact between the lower metallic contact 142 and the lower source/drain region 114. Furthermore, the etched notches 114-1 serve to position the lower-resistance metallic material of the lower metallic contact 142 in closer proximity to the semiconductor channel region (i.e., the vertical semiconductor fin 130), thus shortening the higher resistance path through the semiconductor material of the lower source/drain region 114 between the vertical semiconductor fin 130 and the lower metallic contact 142.

Figure 27:
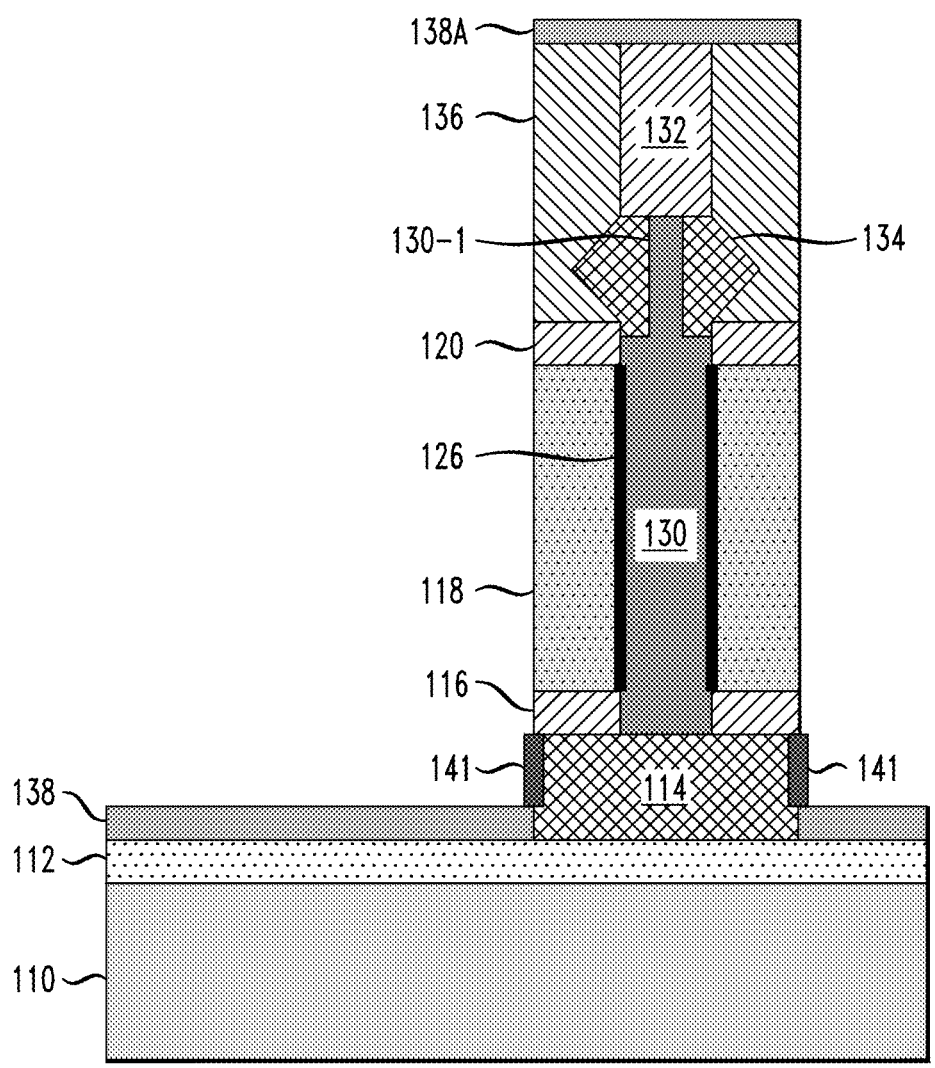
FIG. 27 is a schematic cross-sectional side view of the semiconductor structure of FIG. 12 after forming metal-semiconductor alloy layers on exposed vertical sidewall surfaces of a lower source/drain region, according to another embodiment of the invention.

In another embodiment of the invention, as shown in FIG. 27, the sidewalls of the lower source/drain region 114 can remain vertical (no etched notches) with a metal-semiconductor alloy layer 141 formed on the vertical sidewalls of the lower source/drain region 114. Moreover, while FIG. 1B shows the lower metallic contact 142 surrounding, and in contact with, all sidewalls of the lower source/drain region 114, in other embodiments of the invention, the lower metallic contact 142 can be formed to contact only one sidewall, or less than all sidewalls, of the lower source/drain region 114, depending on the application and target layout. For example, in one embodiment, the lower metallic contact 142 can be formed to contact one long side of the lower source/drain region 114 along the entire length of the vertical semiconductor fin 130.

In all embodiments, the lower metallic contact 142 serves to provide reduced contact resistance to the lower source/drain region 114 as compared to conventional designs. In addition, in one embodiment where the lower metallic contact 142 extends along, and contacts, at least one long side of the lower source/drain region 114 along the entire length of the vertical semiconductor fin 130 (i.e., extends along the device width of the vertical FET device), not only is reduced contact resistance achieved, a more uniform voltage drop is realized along the lower source/drain region 114 between the ends of the vertical semiconductor fin 130, thus leading to higher Vds uniformity along the device width and therefore higher drive current.

It is to be understood that for ease of illustration and discussion, FIGS. 1A and 1B show a single vertical FET device 105 of the semiconductor structure 100. The semiconductor structure 100 has other components including, for example, a plurality of vertical FET devices and other active or passive components forming integrated circuitry, as well as shallow trench isolation (STI) regions formed in the substrate 110, wherein the STI regions define and isolate different device regions in which individual vertical FET devices are formed, etc. Moreover, although one vertical semiconductor fin 130 is shown in FIGS. 1A/1B for ease of illustration, in another embodiment of the invention, a vertical FET device can include a plurality of vertical semiconductor fins that are formed on the lower source/drain region 114, to provide additional FET channel segments to increase the drive current of the vertical FET device. Moreover, while FIG. 1B shows one example layout of an array of vertical contacts 161, 162, and 162, the vertical contacts 161 to the lower metallic contact 142 and the vertical contacts 162 to the gate electrode 152 can be formed with different profiles (e.g., elongated contacts) or disposed on other sides of the vertical FET structure (e.g., adjacent the long ends of the vertical semiconductor fin 130, adjacent both long sides of the vertical semiconductor fin 130, etc.).

Methods for fabricating the semiconductor structure 100 shown in FIGS. 1A/1B will now be discussed in further detail with reference to FIGS. 2 through 26, which schematically illustrate the semiconductor structure 100 of FIGS. 1A/1B at various stages of fabrication. It is to be understood that the schematic views of the semiconductor structures in FIGS. 2-26 are perspective views of the semiconductor structure 100 of FIG. 1A at different stages of fabrication along the Y-Z plane shown in FIG. 1A.

Figure 2:
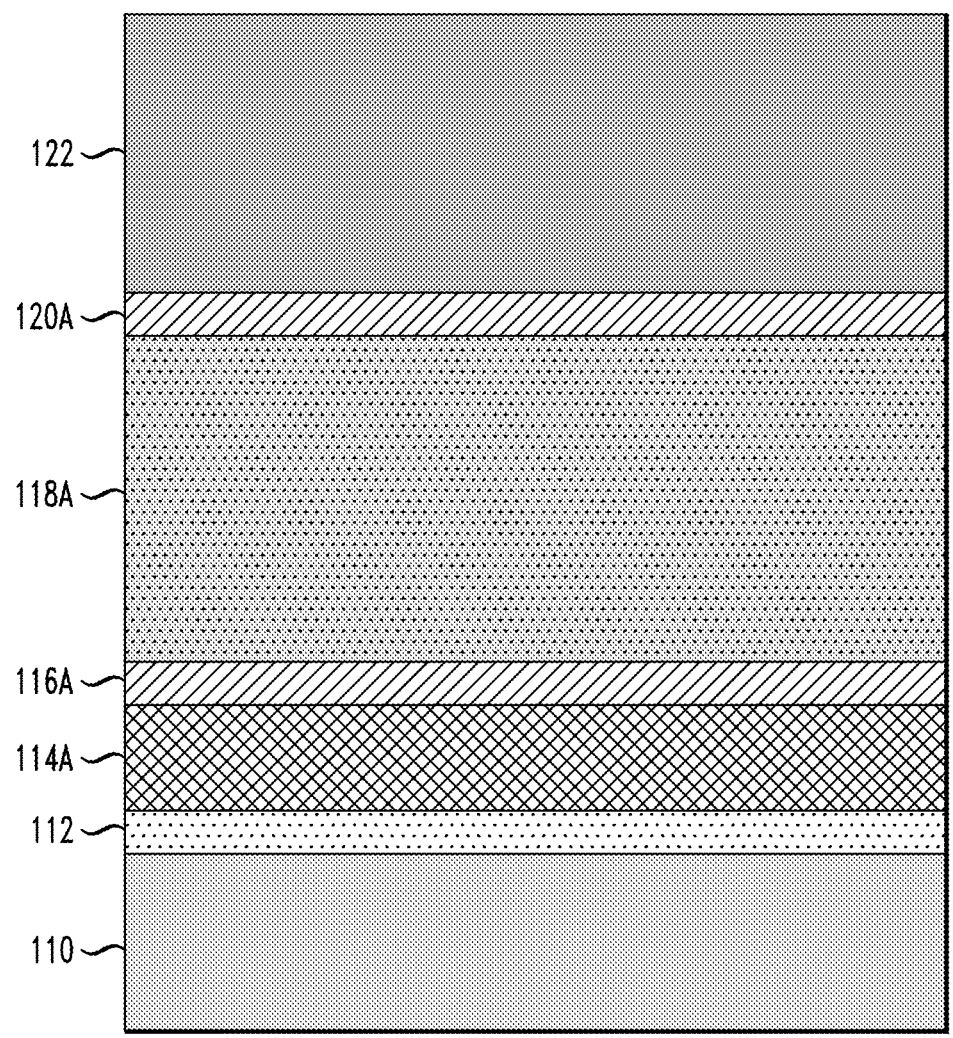

FIG. 2 is a cross-sectional view of a semiconductor structure at an initial stage of fabrication starting with a stack of layers 112, 114A, 116A, 118A, 120A, and 122 sequentially formed on a semiconductor substrate 110, according to an embodiment of the invention. In one embodiment, the substrate 110 comprises bulk semiconductor substrate formed of, e.g., silicon, or other types of semiconductor substrate materials that are commonly used in bulk semiconductor fabrication processes such as germanium, silicon-germanium (SiGe) alloy, silicon carbide (SiC), silicon-germanium carbide (SiGeC) alloy, or compound semiconductor materials (e.g. III-V and II-VI). Non-limiting examples of III-V compound semiconductor materials include gallium arsenide (GaAs), indium arsenide (InAs), InGaAs (Indium Gallium Arsenide), and indium phosphide (InP).

The stack of layers comprises a counter-doped layer 112, an active semiconductor layer 114A, a first spacer layer 116A, a dummy gate layer 118A, a second spacer layer 120A, and an insulating layer 122, which are sequentially formed on top of the semiconductor substrate 110 using known techniques. The counter-doped layer 112 comprises a doped semiconductor layer that is either epitaxially grown on top of the bulk substrate layer 110, or formed by ion implantation. The active semiconductor layer 114A comprises a heavily doped semiconductor layer that is epitaxially grown on top of the counter-doped layer 112. The active semiconductor layer 114A is patterned to form the lower source/drain region 114 for the vertical FET device.

The active semiconductor layer t is doped with a certain type of dopant depending on the type of vertical FET devices (e.g., n-type or p-type) to be formed in a given active device region. The doping of the active semiconductor layer 114A can be performed in-situ during epitaxial growth of the layer, or ex-situ by ion implantation. For example, regions of the active semiconductor layer 114A can be doped with Group III elements (for p-type vertical FET devices) or Group V elements (for n-type vertical FET devices). Typical dopants include Boron, Arsenic, Phosphorus, Gallium, Antimony, etc. For example, boron is a p-type dopant, whereas Phosphorus is an n-type dopant. Depending on the doping type (n or p doping) of the active semiconductor layer 114A, the counter-doped semiconductor layer 112 is doped with an opposite dopant type, so that the layers 112 and 114A provide a reversed biased PN junction which prevents or minimizes leakage into the bulk substrate 110, using techniques known to those of ordinary skill in the art.

The first spacer layer 116A is formed on the active semiconductor layer 114A. In one embodiment, the first spacer layer 116A is formed of silicon nitride. The first spacer layer 116 is patterned during a subsequent fabrication step to form the lower insulating spacer 116 that serves to electrically insulate the lower source/drain region 114 of a vertical FET device from the metal gate structure of the vertical FET device 105.

The dummy gate layer 118A is formed of a sacrificial semiconductor material, such as amorphous silicon. The dummy gate layer 118A is subsequently patterned to form a dummy gate structure 118 (see FIG. 10) that surrounds the vertical semiconductor fin 130. The dummy gate structure 118 is subsequently removed and replaced with a metal gate structure using a RMG (replacement metal gate) process flow, as discussed in further detail below.

The second spacer layer 120A is formed on the dummy gate layer 118A. In one embodiment, the second spacer layer 120A is formed of silicon nitride. The second spacer layer 120A is patterned during a subsequent fabrication step to form the upper insulating spacer 120 that electrically insulates the upper source/drain region 134 of the vertical FET device from the metal gate structure of the vertical FET device. The insulating layer 122 is formed on the second spacer layer 120A. In one embodiment, the insulating layer 122 comprises a sacrificial material, such as silicon oxide, which can be etched selective to the material of the second spacer layer 120A.

Figure 3:
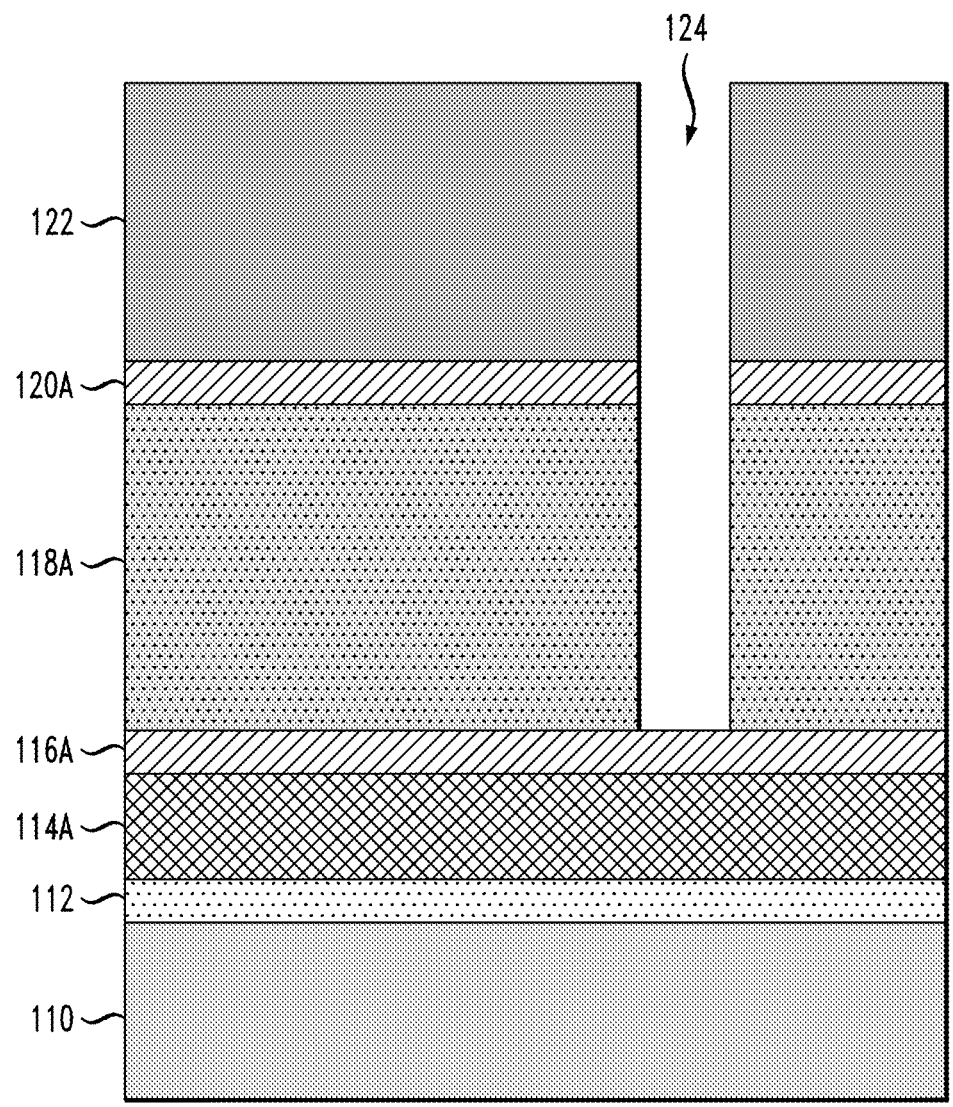

A next step in the fabrication process flow comprises etching one or more openings in the stack of layers which define a pattern of one or more semiconductor fins to be formed for a given vertical FET device. For example, FIG. 3 is a schematic cross-sectional view of the semiconductor structure of FIG. 2 after etching a trench opening 124 through the layers 118A, 120A, and 122 down to the first spacer layer 116A, according to an embodiment of the invention. The opening 124 defines a vertical semiconductor fin structure that is to be subsequently formed to provide a vertical channel for a vertical FET device. The opening 124 is formed using known techniques. For example, a layer of photoresist material is deposited on top of the layer of insulating material 122 and lithographically patterned (exposed and developed) to form a photoresist mask having a target pattern which defines a pattern of openings to be transferred to the stack of layers.

A directional dry etch process (e.g., plasma etch) is then performed using the photoresist mask to etch the trench opening 124 down to the first spacer layer 116A. With this process, the directional dry etch process is performed with an etch chemistry that is suitable to form high-aspect ratio trench openings with substantially vertical sidewalls through the stack of layers 122, 120A and 118A. The etch process can be performed using one continuous etch process, or a sequence of separate etch processes with different etch chemistries, using techniques and etch chemistries that are suitable to etch the materials that form the different layers 122, 120A and 118A.

Figure 4:
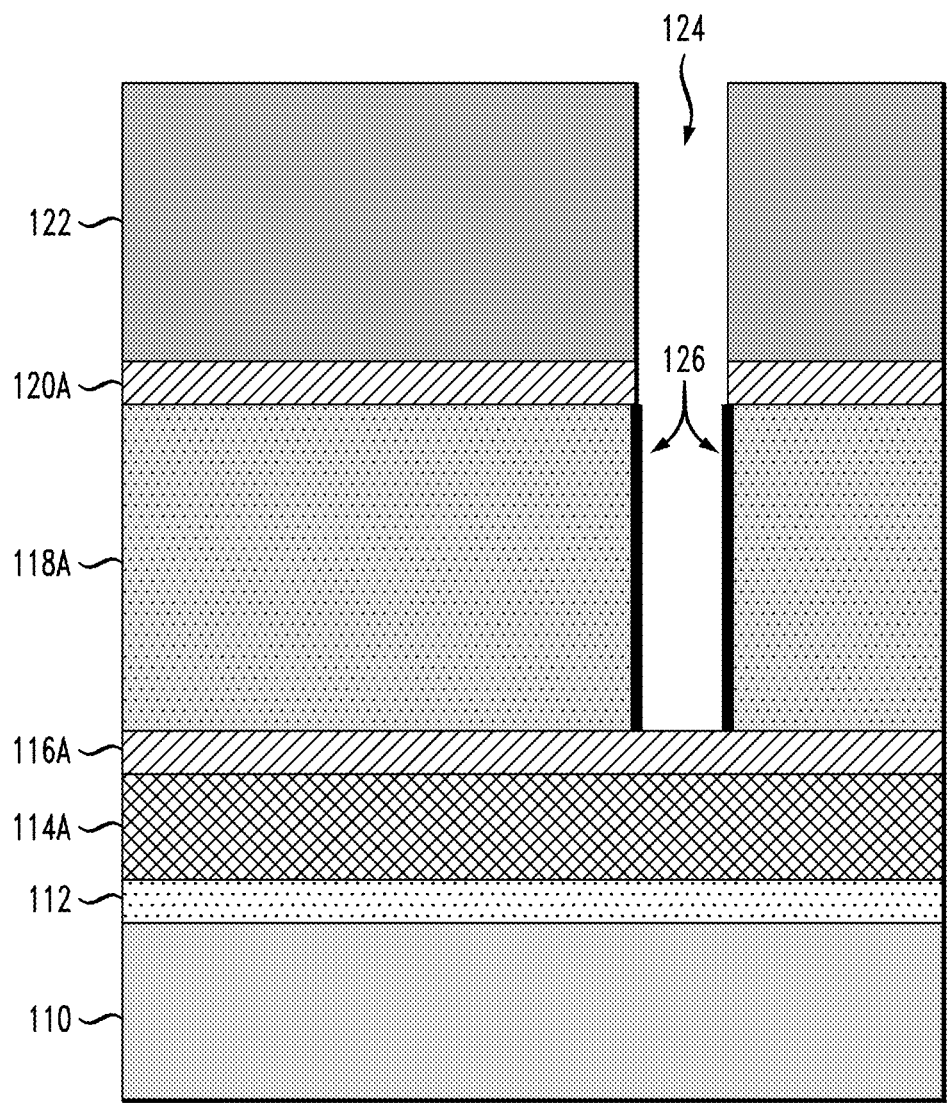

A next step in the fabrication process flow comprises forming a thin oxide layer on the exposed sidewall surfaces of the dummy gate layer 118A in the trench opening 124. For example, FIG. 4 is a schematic cross-sectional view of the semiconductor structure of FIG. 3 after forming a thin layer of oxide 126 on the expose surfaces of the dummy gate layer 118A within the trench opening 124, according to an embodiment of the invention. In one embodiment, the thin oxide layer 126 has a thickness in a range of about 1 nm to about 2 nm. The oxide layer 126 can be formed using a plasma oxidation process, or any other suitable technique for selectively oxidizing the exposed sidewall surfaces of the dummy gate layer 118A within the trench opening 124. The thin oxide layer 126 serves to protect a sidewall surface of the vertical semiconductor fin 130 (i.e., vertical channel structure) during subsequent RMG processing steps.

Figure 5:
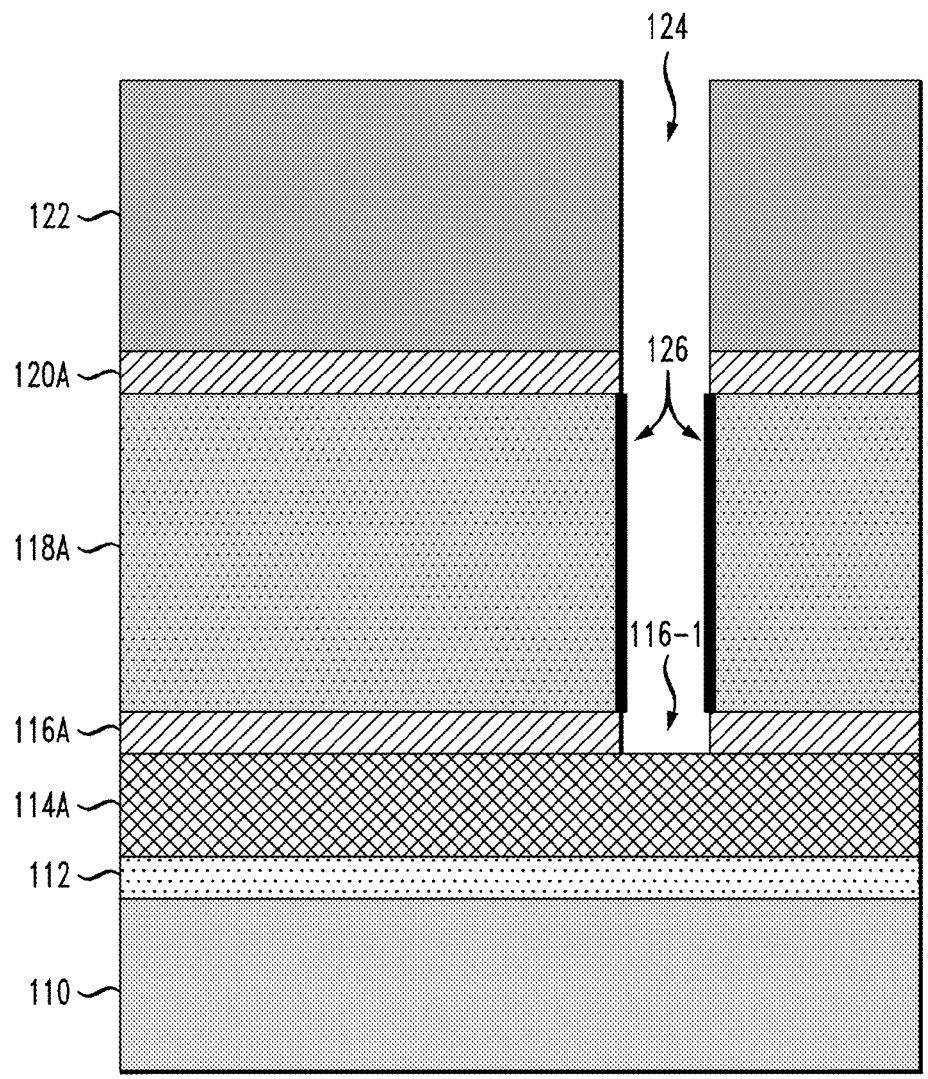

Following the selective oxidation of the sidewall surfaces of the dummy gate layer 118A, a next step comprises etching the exposed portion of the first spacer layer 116A at the bottom of the trench opening 124. For example, FIG. 5 is a schematic cross-sectional view of the semiconductor structure of FIG. 4 after etching an opening 116-1 in the first spacer layer 116A at the bottom of the trench opening 124, according to an embodiment of the invention. In one embodiment, the exposed material of the first spacer layer 116A is etched using a suitable etch process and etch chemistry to etch the first spacer layer 116A selective to the underlying material of the active semiconductor layer 114A.

Figure 6:
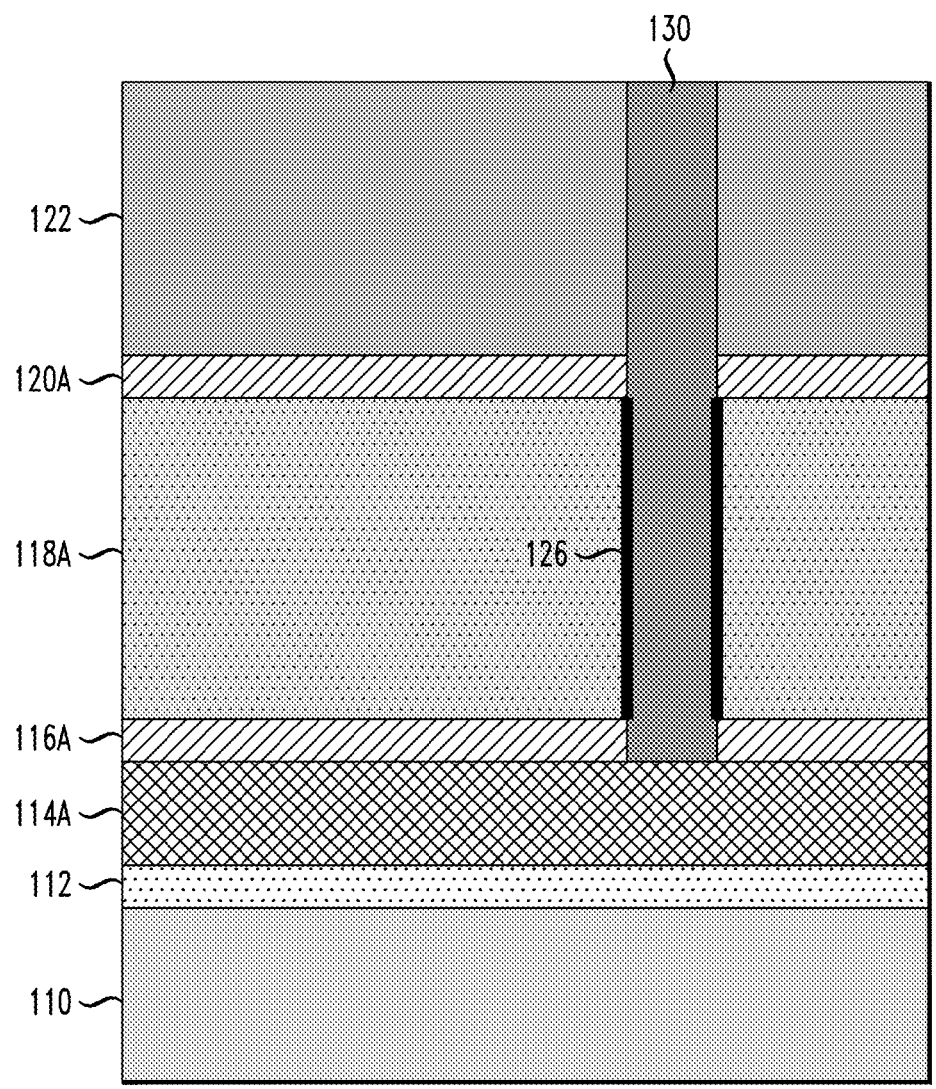

A next step in the fabrication process flow comprises forming a vertical semiconductor fin in each the trench opening 124. For example, FIG. 6 is a schematic cross-sectional view of the semiconductor structure of FIG. 5 after forming the vertical semiconductor fin 130 within the trench opening 124, according to an embodiment of the invention. In one embodiment of the invention, the vertical semiconductor fin 130 comprises an epitaxial semiconductor material that is epitaxially grown bottom-up, staring on the exposed surface of the active semiconductor layer 114A at the bottom of the trench opening 124. The vertical semiconductor fin 130 can be formed of any type of epitaxial semiconductor material including, but not limited to, Si, $Si_xGe_y$, GaAs, InGaAs, or other types of epitaxial compound semiconductor materials which are suitable for the target application. The vertical semiconductor fin 130 can be epitaxially grown using known techniques, such as CVD (chemical vapor deposition), MOCVD (metal-organic CVD), LPCVD (Low Pressure CVD), MBE (molecular beam epitaxy), VPE (vapor-phase epitaxy), or other known epitaxial growth techniques. Following the epitaxial growth process, the overburden epitaxial semiconductor material that protrudes from the trench opening 124 is removed using a CMP (chemical mechanical planarization) process, which results in a planarized surface, as shown in FIG. 6.

Figure 7:
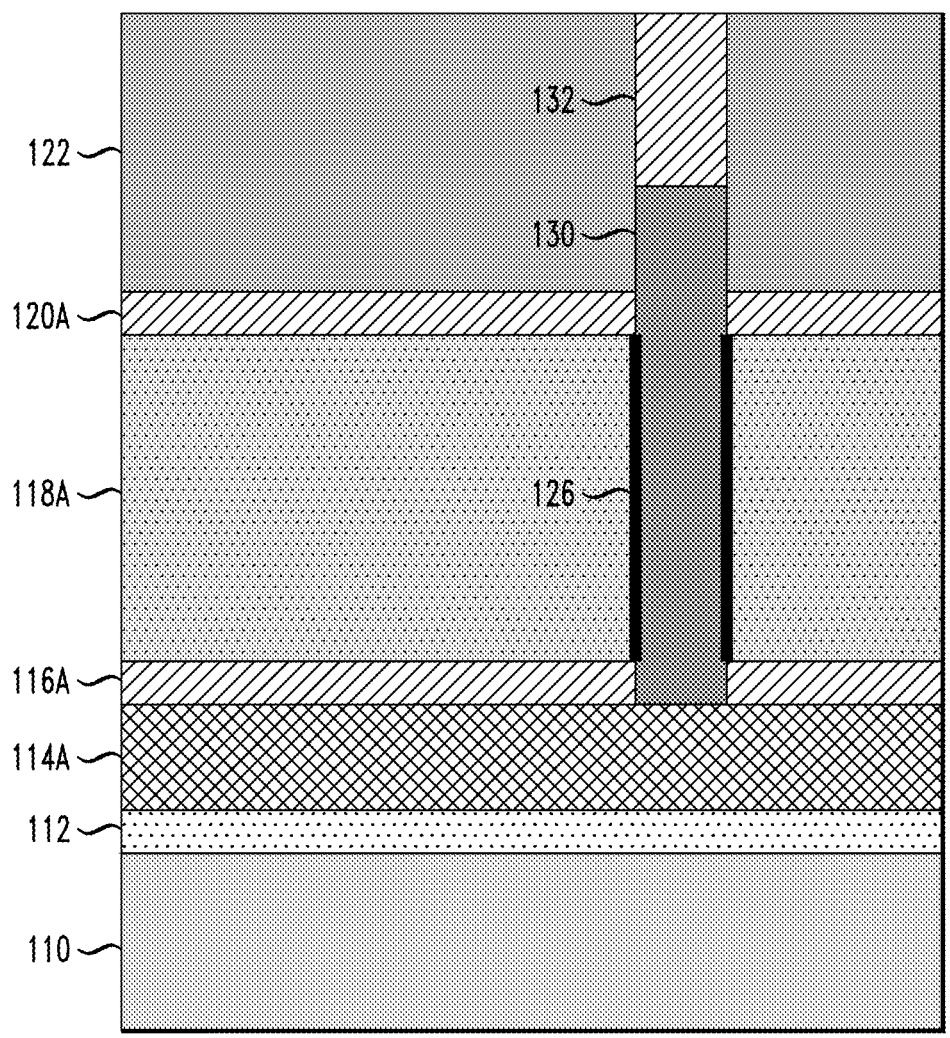

Next, as shown in FIG. 7, an etch process is performed to recess an upper portion of the vertical semiconductor fin 130 and form a capping layer on top of the recessed vertical semiconductor fin 130. In particular, FIG. 7 is schematic cross-sectional view of the semiconductor structure of FIG. 5 after recessing the vertical semiconductor fin 130 down below the planarized surface of the insulating layer 122, and filling an upper portion of the trench opening 124 with a capping layer 132. In one embodiment, the upper portion of the vertical semiconductor fine 130 can be etched using a suitable etch process such as gas phase etching. For example, when formed of silicon material, the vertical semiconductor fin 130 can be gas phase etched using HCL gas. After recessing the vertical semiconductor fin 130, a layer of insulating material, such as silicon nitride, is deposited to fill the upper portion of the trench opening 124 with insulating material. Following deposition, a CMP process is performed to remove the overburden insulating material, and planarize the surface of the insulating layer 122, resulting in the formation of the capping layer 132, as shown in FIG. 7. In one embodiment of the invention, the capping layer 132 is formed of silicon nitride, or any other suitable insulating/dielectric material that has etch selectivity with respect to the material (e.g., oxide) of the insulating layer 122.

Figure 8:
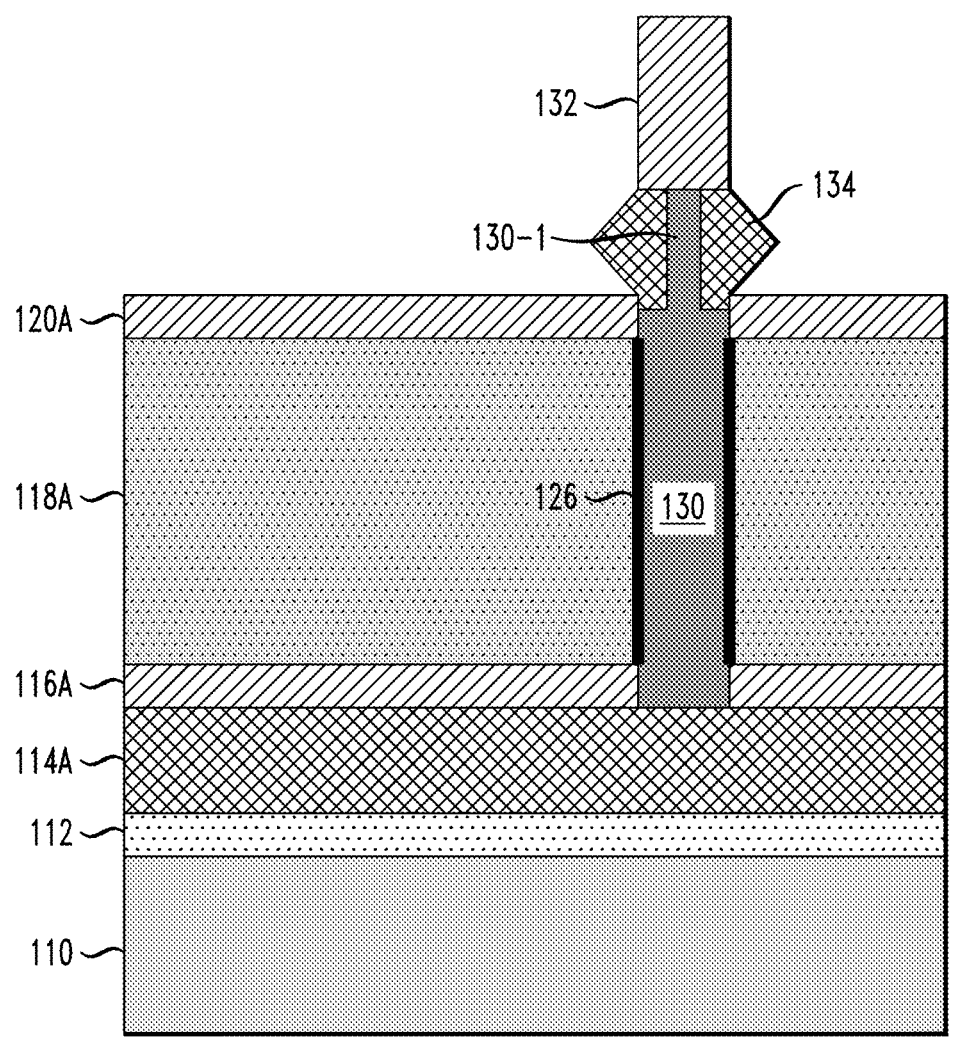

Following formation of the capping layer 132, the fabrication process continues with a process flow that comprises removing the insulating layer 122, laterally recessing exposed sidewall surfaces of the upper portion of the vertical semiconductor fin 130, and epitaxially growing an upper source/drain region on the recessed sidewall surfaces of the semiconductor fin 130. For example, FIG. 8 is schematic cross-sectional view of the semiconductor structure of FIG. 7 after etching away the insulating layer 122 down to the second spacer layer 120A, forming a thinned vertical fin structure 130-1, and epitaxially growing the upper source/drain region 134 on the thinned vertical fin structure 130-1.

The insulating layer 122 (e.g., oxide layer) can be removed using any suitable etch process with an etch chemistry that etches the material of the insulating layer 122 selective to the materials of the second spacer layer 120A, the capping layer 132, and the vertical semiconductor fin 130. Once the insulating layer 122 is removed, the exposed sidewall surfaces of the vertical semiconductor in 130 are laterally recessed to form the thinned vertical fin structure 130-1. In one embodiment, the exposed sidewall surfaces of the vertical semiconductor fin 130 can be etched using a dry etch process (e.g., RIE) process or a wet etch. For example, the sidewall etch process can be performed using an in-situ diluted HCL etch process, in which the amount of sidewall material etched away is controlled by a timed etch. In one embodiment of the invention, wherein the original width of the vertical semiconductor fin 130 is in a range of about 6 nm to about 15 nm, the sidewalls of the vertical semiconductor fin 130 can be laterally etched to a distance about 1 nm to 2 nm, for example, to form the thinned vertical fin structure 130-1.

The upper source/drain region 134 is formed by growing a layer of epitaxial semiconductor material on the recessed sidewalls of the thinned vertical fin structure 130-1. In one embodiment of the invention, the upper source/drain region 134 is formed by epitaxially growing a faceted SiGe layer on the recessed sidewalls of the thinned vertical fin structure 130-1, which comprises a trapezoidal or diamond-shaped structure as shown in FIG. 8. In one embodiment, the epitaxial growth process (e.g., SiGe epitaxy) proceeds until enough epitaxial semiconductor material (e.g., SiGe) is grown on the recessed sidewalls of the thinned vertical fin structure 130-1 to replace the amount (in thickness) of the original semiconductor material that was laterally etched away from the exposed sidewalls of the vertical semiconductor fin structure 130. Besides SiGe, the upper source/drain region 134 can be epitaxially grown with other types of semiconductor materials such as Si, Ge, or III-V compound semiconductor materials, for example. The upper source/drain region 134 is doped with a certain type of dopant depending on the type of vertical FET device (e.g., n-type or p-type) to be formed in the given active device region. The doping of the upper source/drain region 134 can be performed in-situ during epitaxial growth of the layer, or ex-situ by ion implantation. For example, the upper source/drain region can be doped with Group III elements (for a p-type vertical FET device) or Group V elements (for an n-type vertical FET device).

Figure 9:
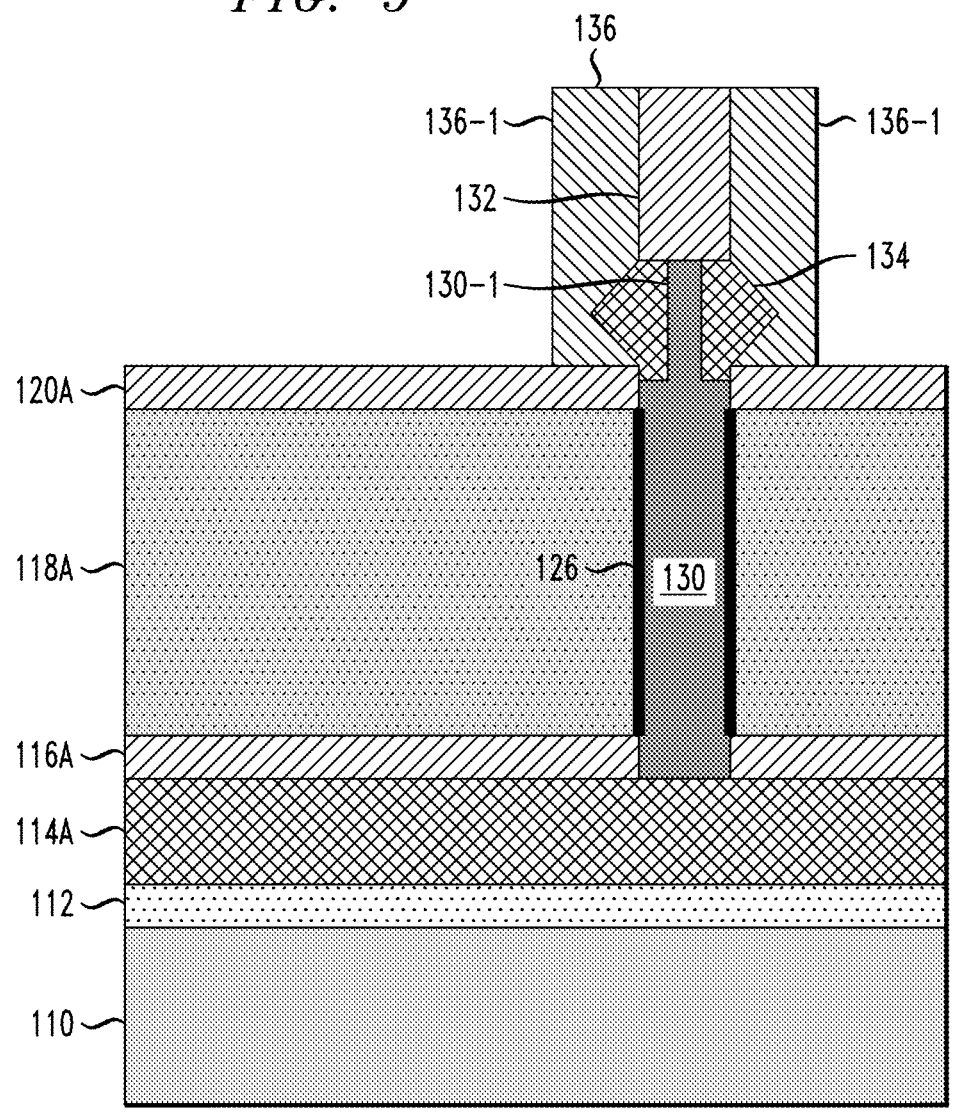
Figure 10:
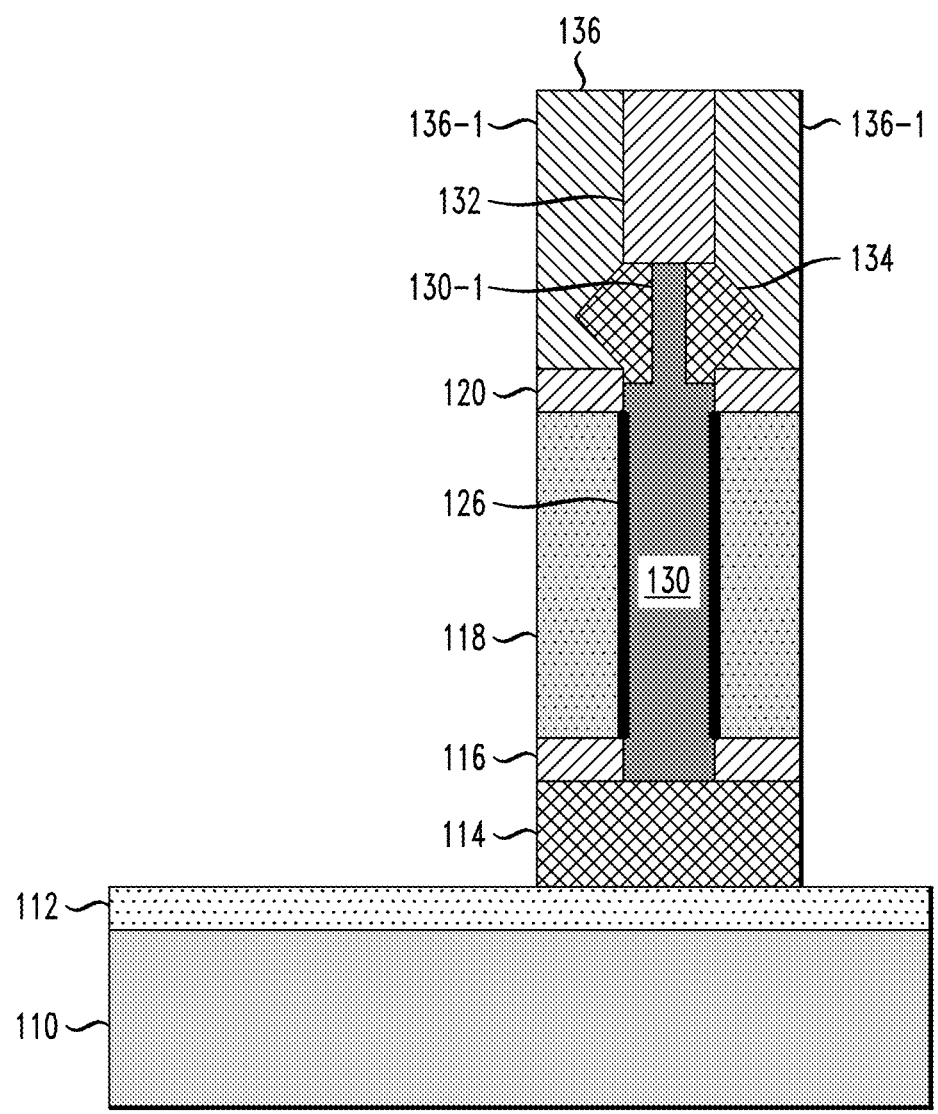

Following formation of the upper source/drain region 134, FIGS. 9 and 10 schematically illustrate a next sequence of steps in the fabrication process which comprise encapsulating the upper source/drain region 134 in an insulating material which serves to protect the upper source/drain region 134, and which is patterned to form an encapsulation structure that is used as an etch mask to pattern the second spacer layer 120A, the dummy gate layer 118A, the first spacer layer 116A, and the active semiconductor layer 114A. In particular, FIG. 9 is a schematic cross-sectional side view of the semiconductor structure of FIG. 8 after forming an encapsulation structure 136 (e.g., a spacer-like structure) that encapsulates the upper source/drain region 134, according to an embodiment of the invention. In one embodiment of the invention, the encapsulation structure 136 is formed by a process which comprises blanket depositing a layer of insulating material (such as silicon nitride) over the semiconductor structure shown in FIG. 8, planarizing the layer of insulating material down to the capping layer 132, and then forming an etch mask to pattern the planarized layer of insulating material to form the encapsulation structure 136 with vertical sidewalls 136-1, as shown in FIG. 9.

The vertical sidewalls 136-1 of the encapsulation structure 136 extend past the vertical sidewalls of the vertical semiconductor fin 130 at a given distance which defines the footprint of the device structures that are to be formed after etching the underlying layers 120A, 118A, 116A, and 114A using the encapsulation structure 136 as an etch mask. In particular, FIG. 10 is a schematic cross-sectional side view of the semiconductor structure of FIG. 9 after using the encapsulation structure 136 as an etch mask during one or more sequential etch processes that are performed to vertically etch the exposed portions of the underlying layers 120A, 118A, 116A, and 114A down to the counter-doped semiconductor layer 112, and thereby form the upper and lower spacers 120 and 116, the dummy gate structure 118, and the lower source/drain region 114, as shown in FIG. 10. In later processing steps, the dummy gate structure 118 is removed and replaced with a metal gate structure as part of an RMG process.

Figure 11:
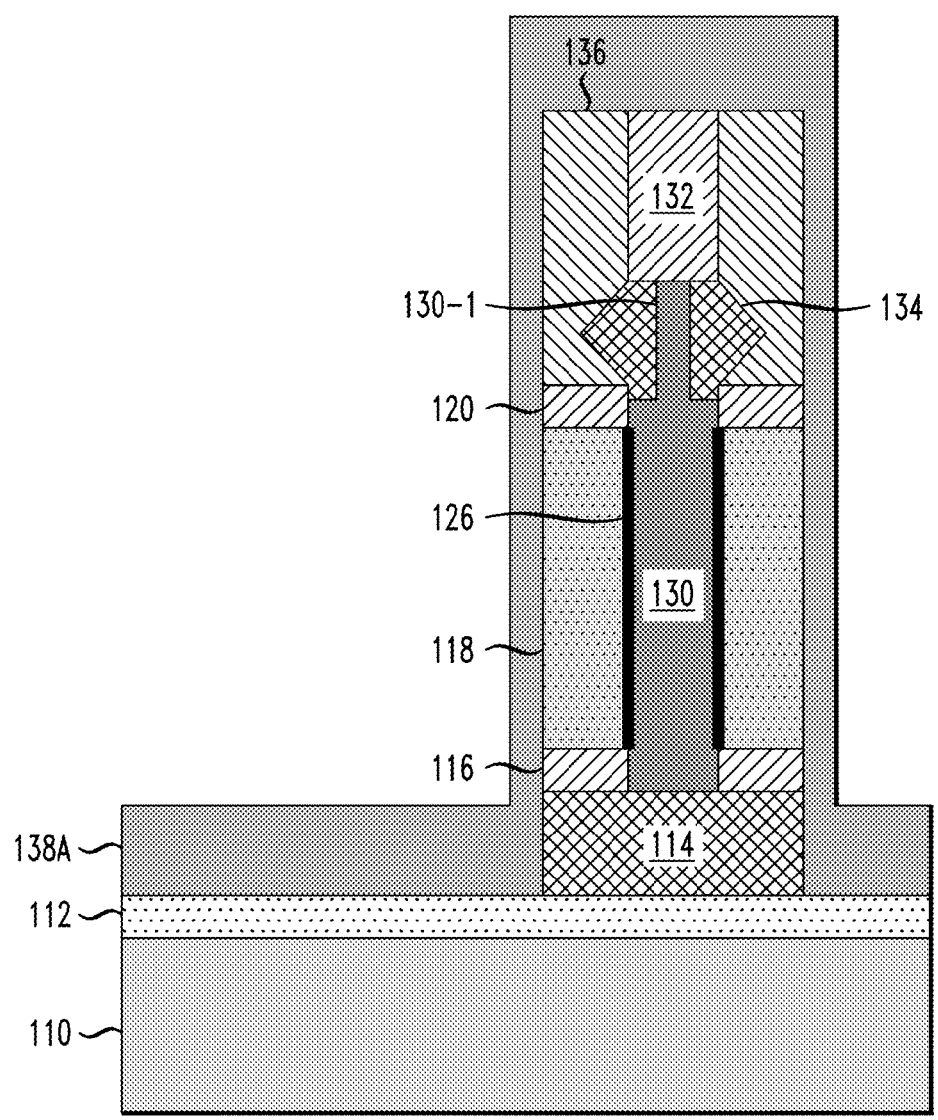

A next sequence of steps in the exemplary fabrication process, as schematically illustrated in FIGS. 10 and 11, include depositing and patterning a layer of insulating material (e.g., an oxide material) to form the lower insulating spacer 138 that electrically insulates the counter-doped semiconductor layer 112 from the lower metallic contact 142 (which is subsequently formed to wrap around the sides of the lower source/drain region 114). In particular, FIG. 11 is a schematic cross-sectional side view of the semiconductor structure of FIG. 10 after depositing a layer of oxide material 138A, according to an embodiment of the invention. In one embodiment, the layer of oxide material 138A is deposited using a directional HDP (High Density Plasma) deposition process, which results in the deposition of a thick layer of oxide material on horizontal surfaces and a thin layer of oxide material on vertical surfaces. For example, as shown in FIG. 11, the layer of oxide material 138A as deposited on the surface of the counter-doped semiconductor layer 112 and on the upper surface of the encapsulation structure 136 is thicker than the layer of oxide material 138A as deposited on the vertical sidewalls of the vertical structure shown in FIG. 11. In one embodiment, the layer of oxide material 138A formed on the horizontal surfaces has a thickness of about 10 nm, whereas the layer of oxide material 138A formed on the vertical surfaces has a thickness of about 3 nm.

Figure 12:
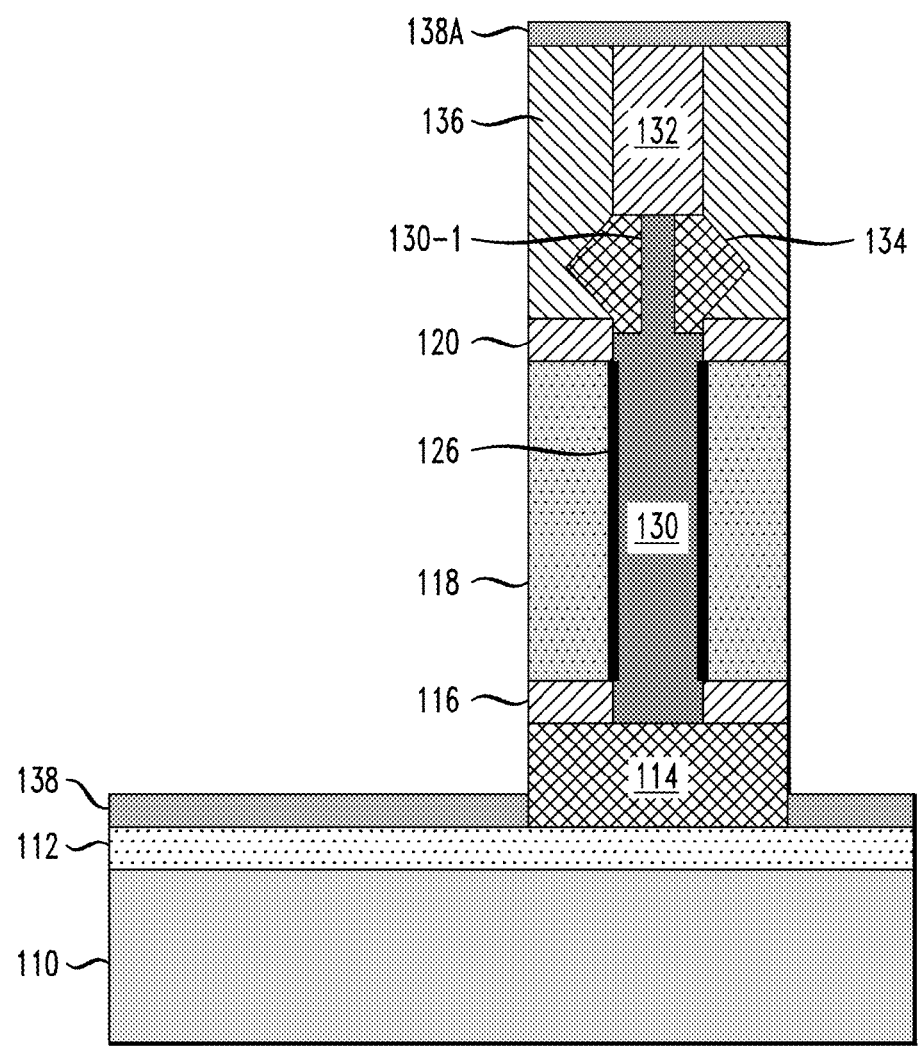

Next, FIG. 12 is a schematic cross-sectional side view of the semiconductor structure of FIG. 11 after performing an oxide recess process to remove the layer of oxide material 138A from the vertical surfaces of the semiconductor structure and form the bottom spacer 138 on the exposed surface of the counter-doped semiconductor layer 112, according to an embodiment of the invention. In one embodiment of the invention, the oxide recess process is performed using an oxide etch process that concurrently etches the oxide material on the horizontal and vertical surfaces at essentially the same etch rate, thereby removing all the oxide material from the vertical surfaces and etching down the oxide material on the horizontal surface to a desired thickness. For example, in an example embodiment in which 10 nm of oxide material is formed on the horizontal surfaces and 3 nm of oxide material is formed on the vertical surfaces, an oxide etch process that is timed to remove 4 nm of oxide material will effectively remove all oxide material from the vertical surfaces, while leaving about 6 nm of oxide material on the horizontal surface. As shown in FIG. 12, the etching of the layer of oxide material 138A results in the formation of the bottom spacer 138 on the counter-doped semiconductor layer 112, as well as a remaining layer of oxide material 138A on top of the encapsulation structure 136.

Figure 13:
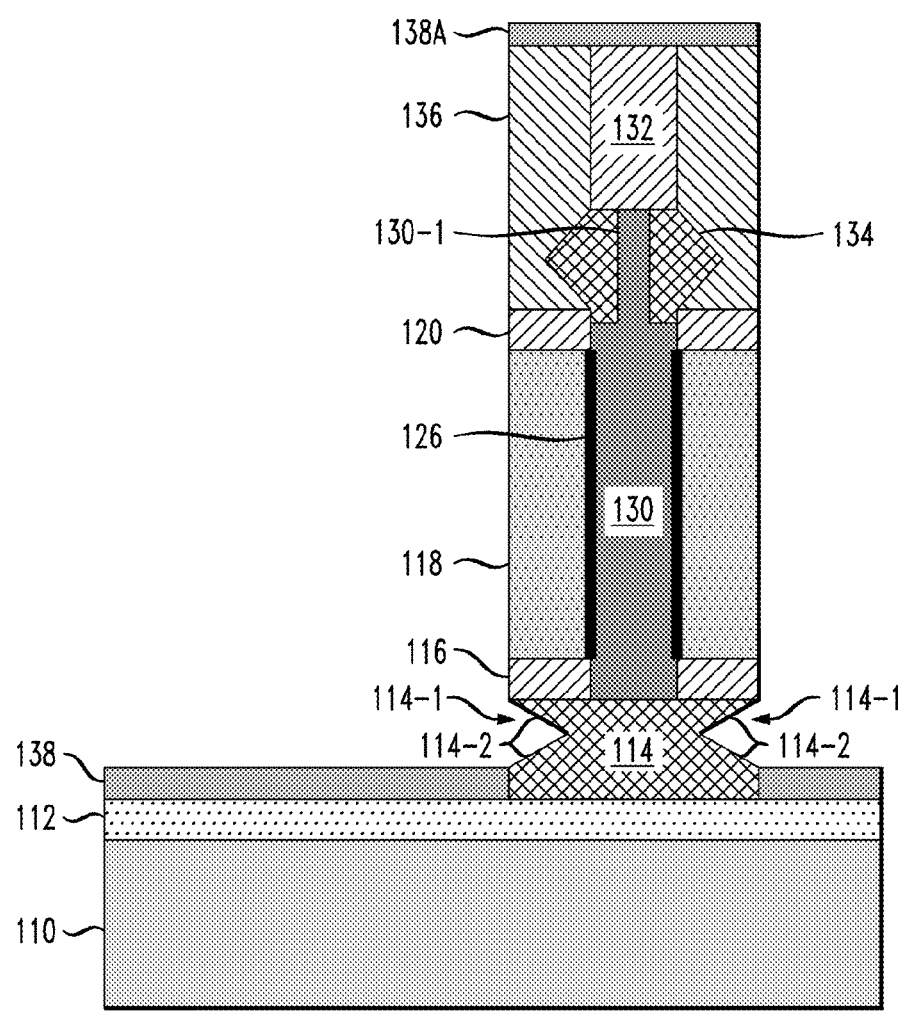
Figure 14:
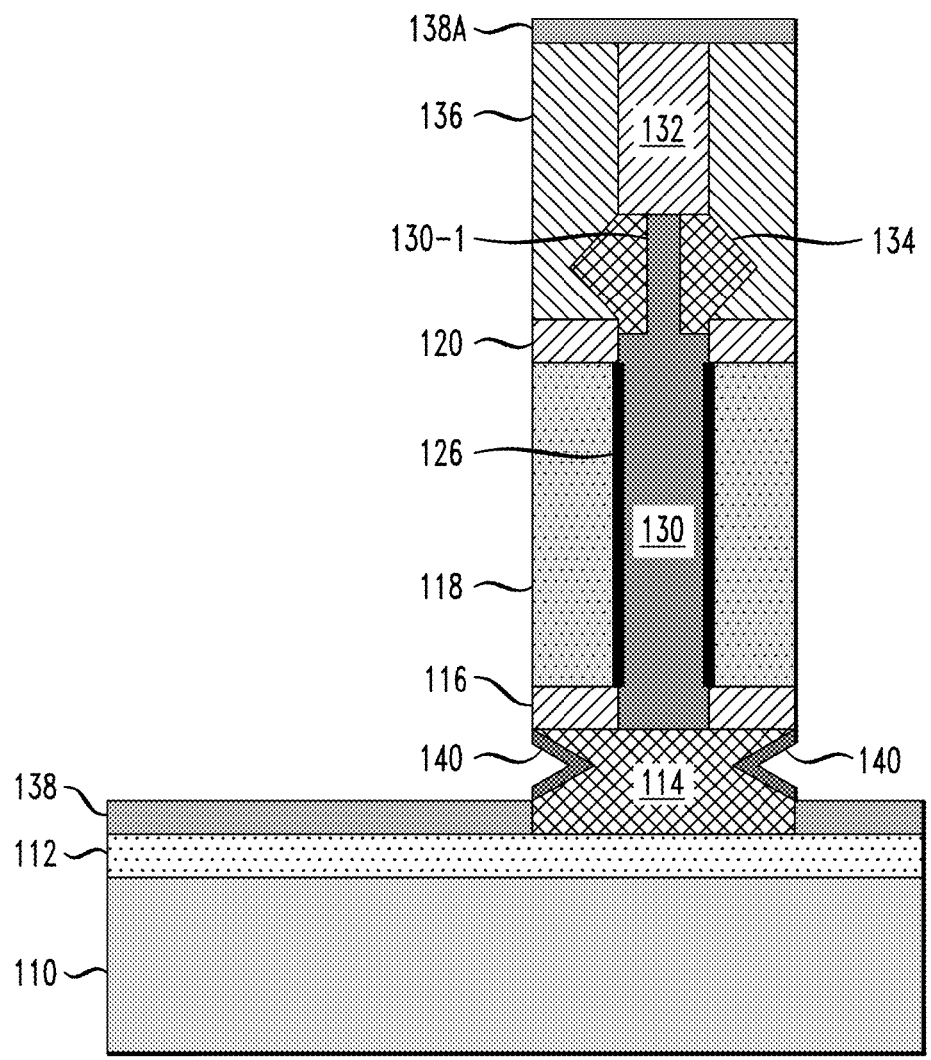

A next sequence of steps in the exemplary fabrication process, as schematically illustrated in FIGS. 13 and 14 is to etch notches with angled surfaces in the exposed sidewall surfaces of the lower source/drain region 114 and form a metal-semiconductor alloy layer on the angled surfaces of the notches etched into the sidewalls of the lower source/drain region 114. For example, FIG. 13 is a schematic cross-sectional side view of the semiconductor structure of FIG. 12 after forming angled notches 114-1 on the exposed sidewalls of the lower source/drain region 114, according to an embodiment of the invention. In one embodiment, the angled notches 114-1 are formed by "sigma-etching" the exposed sidewalls of the lower source/drain region 114 to form "sigma-shaped" notches in the sidewalls of the lower source/drain region 114, which are defined by angled surfaces 114-2.

The angled notches 114-1 are formed as a result of the different etching rates of the different crystalline planes of the epitaxial material of the lower source/drain region 114. For example, the notches 114-1 can be formed by anisotropic wet-etching (e.g., utilizing tetramethyl ammonium hydroxide (THAM), ammonium hydroxide, and/or potassium hydroxide (KOH)). the exposed sidewall surfaces of the lower source/drain region 114, which etches the surfaces of the epitaxial material having a crystalline plane of (100)

at an etch rate which is faster than the etch rate at which the surfaces having a crystalline plane of (111) are etched. The characteristic "sigma" shape of the etched sidewalls of the lower source/drain region is formed as a result of the slower etch-rate which results after reaching the surfaces which have a crystalline plane of (111), at which time the sigma etch is terminated.

Next, FIG. 14 is a schematic cross-sectional side view of the semiconductor structure of FIG. 13 after forming metal-semiconductor alloy layers 140 on the angled surfaces 114-2 of the notches 114, according to an embodiment of the invention. In one embodiment, the metal-semiconductor alloy layers 140 are formed using a salicide process. For example, after forming the notches 114-1 in the sidewalls of the lower source/drain region 114, a thin conformal layer of metallic material is deposited over the semiconductor structure of FIG. 13 to cover the exposed angled surfaces 114-2 of the notches 114-1. The layer of metallic material can include a transition metal such as nickel (Ni), cobalt (Co), titanium (Ti), platinum (Pt), tungsten (W), tantalum (Ta), an alloy such as TiAl or TiN, etc., or any other suitable metallic material. The metallic material can be deposited using ALD or other suitable deposition methods (e.g., PVD, CVD, etc.). Prior to deposition of the layer of metallic material, a preclean process can be performed to remove any surface impurities or oxides from the exposed angled surfaces 114-2 of the epitaxial semiconductor material of the lower source/drain region 114.

Following deposition of the layer of metallic material, a thermal anneal process is performed at an appropriate temperature to induce a reaction between the epitaxial semiconductor material of the lower source/drain region 114 and the metallic material disposed on the angled surfaces 114-2 of the notches 114-1 to form the metal-semiconductor alloy layers 140, as shown in FIG. 14. In one embodiment, when the lower source/drain region 114 is formed of silicon (Si), the metal-semiconductor alloy layers 140 comprise silicide layers. In other embodiments, when the lower source/drain region 114 is formed of semiconductor materials (e.g., III-V semiconductor compounds) other than Si, other types of metal-semiconductor alloy layers can be formed (e.g., Ni with InGaAs, etc.). Following the formation of the metal-semiconductor alloy layers 140, any remaining (unreacted) metallic material is removed using a suitable etch process that is selective to other materials of the existing structure and which does not etch or otherwise damage the exposed surfaces of the metal semiconductor alloy layers 140.

Figure 15:
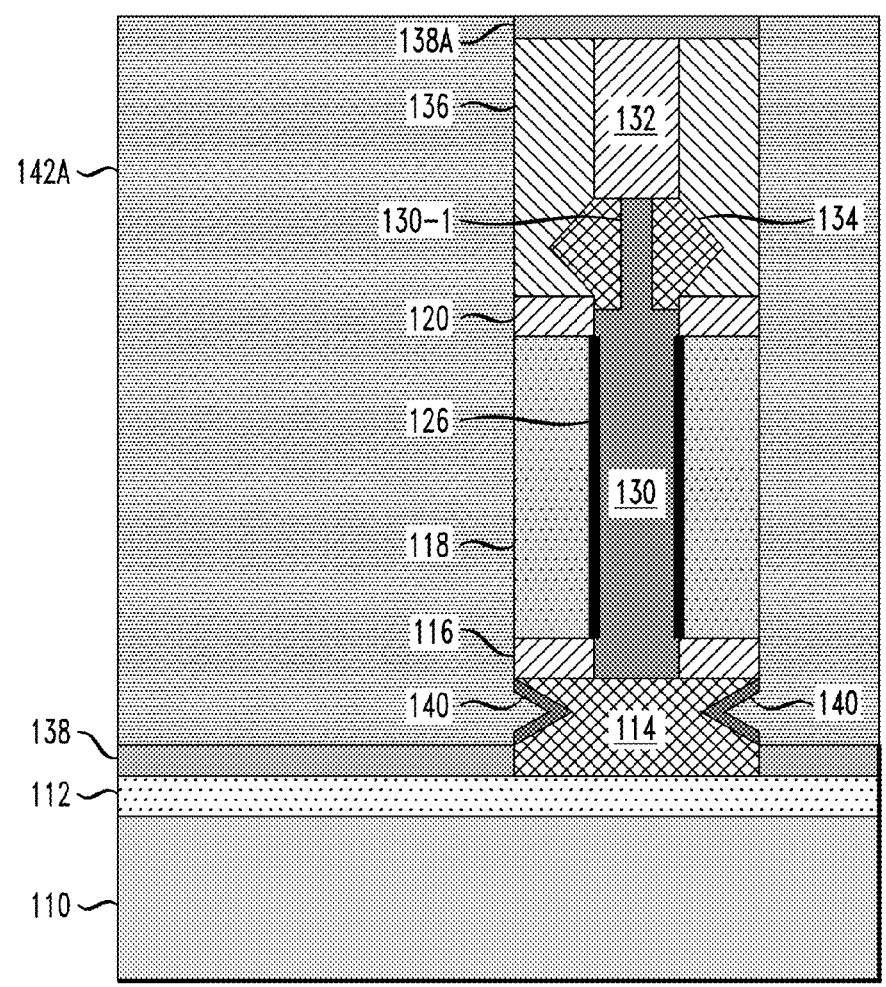
Figure 16:
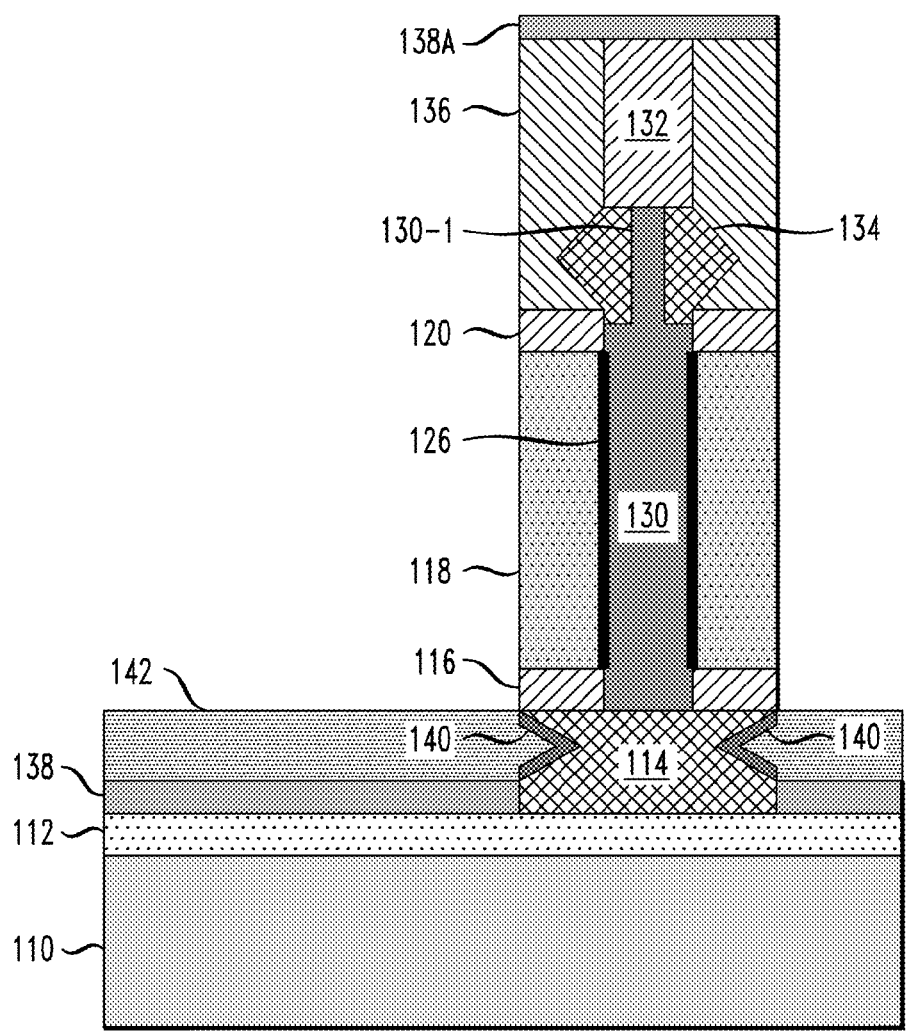

A next sequence of steps in the exemplary fabrication process, as schematically illustrated in FIGS. 15 and 16, comprise a process flow to form the lower metallic contact 142 as shown in FIG. 1A, which wraps around the sides of the lower source/drain region 114. For example, FIG. 15 is a schematic cross-sectional side view of the semiconductor structure of FIG. 14 after blanket depositing and planarizing a layer of conductive material 142A which is used to form the lower metallic contact 142, according to an embodiment of the invention. The conductive material 142A includes, but is not limited to, copper (Cu), tungsten (W), cobalt (Co), aluminum (Al), titanium (Ti), tantalum (Ta), or any other conductive material that is suitable for the given application.

Next, FIG. 16 is a schematic cross-sectional side view of the semiconductor structure of FIG. 15 after etching down the layer of conductive material 142A to form the lower metallic contact 142, according to an embodiment of the invention. In one embodiment, the etch process is performed using a suitable etch process and etch chemistry to recess the layer of conductive material 142A down to a target level, e.g., down to a level that is approximately co-planar with the interface between the lower spacer 116 and the lower source/drain region 114, as shown in FIG. 16. In one embodiment of the invention, the resulting lower metallic contact 142 is formed with a thickness in a range of about 5 nm to about 20 nm.

Figure 17:
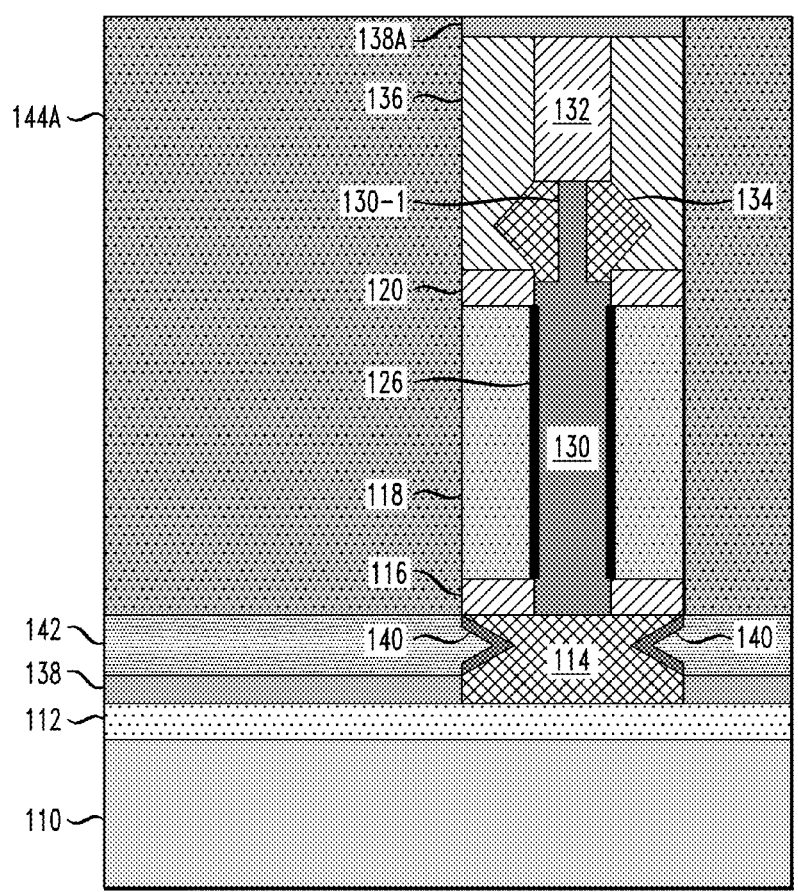
Figure 18:
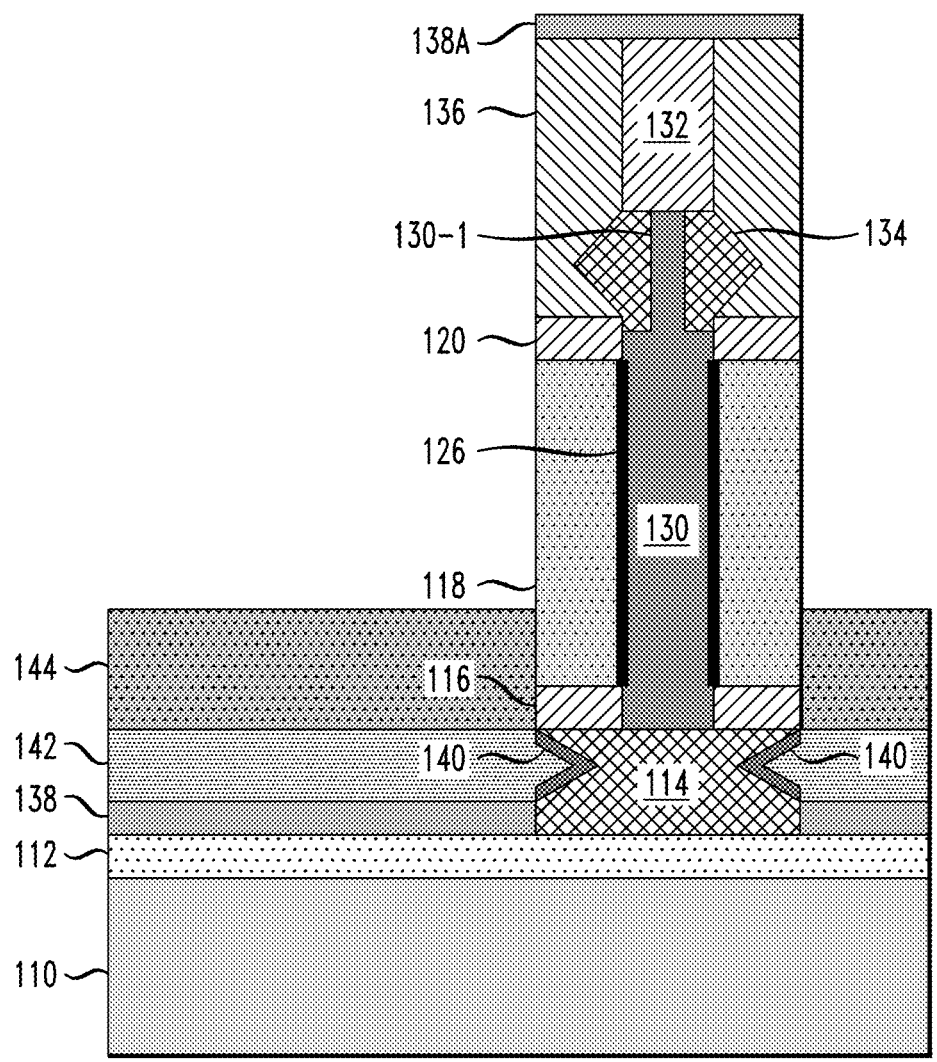

A next sequence of steps in the exemplary fabrication process, as schematically illustrated in FIGS. 17 and 18, comprise a process flow to form the dielectric spacer 144 shown in FIG. 1A. For example, FIG. 17 is a schematic cross-sectional side view of the semiconductor structure of FIG. 16 after blanket depositing and planarizing a layer of dielectric material 144A which is used to form the dielectric spacer 144, according to an embodiment of the invention. The layer of dielectric material 144A may include, for example, $SiO_2$, SiN, SiBCN or SiOCN, or other dielectric materials that are suitable for the given application and process flow. The layer of dielectric material 144A may be deposited using known deposition techniques, such as, for example, atomic layer deposition (ALD), chemical vapor deposition (CVD), plasma enhanced chemical vapor deposition (PECVD), spin on deposition, physical vapor deposition (PVD), etc.

Next, FIG. 18 is a schematic cross-sectional side view of the semiconductor structure of FIG. 17 after etching down the layer of dielectric material 144A to form the dielectric spacer 144. In one embodiment, the etch process is performed using a suitable etch process and etch chemistry to recess the layer of dielectric material 144A down to a target thickness. For example, the dielectric spacer 144 is formed to have a target thickness which is greater than a thickness of the lower insulating spacer 118, but which does not completely cover the dummy gate structure 118. In one example embodiment, the upper surface of the dielectric spacer 144 is recessed to a level that is less than about one-half of the vertical length of the dummy gate structure 118.

Figure 19:
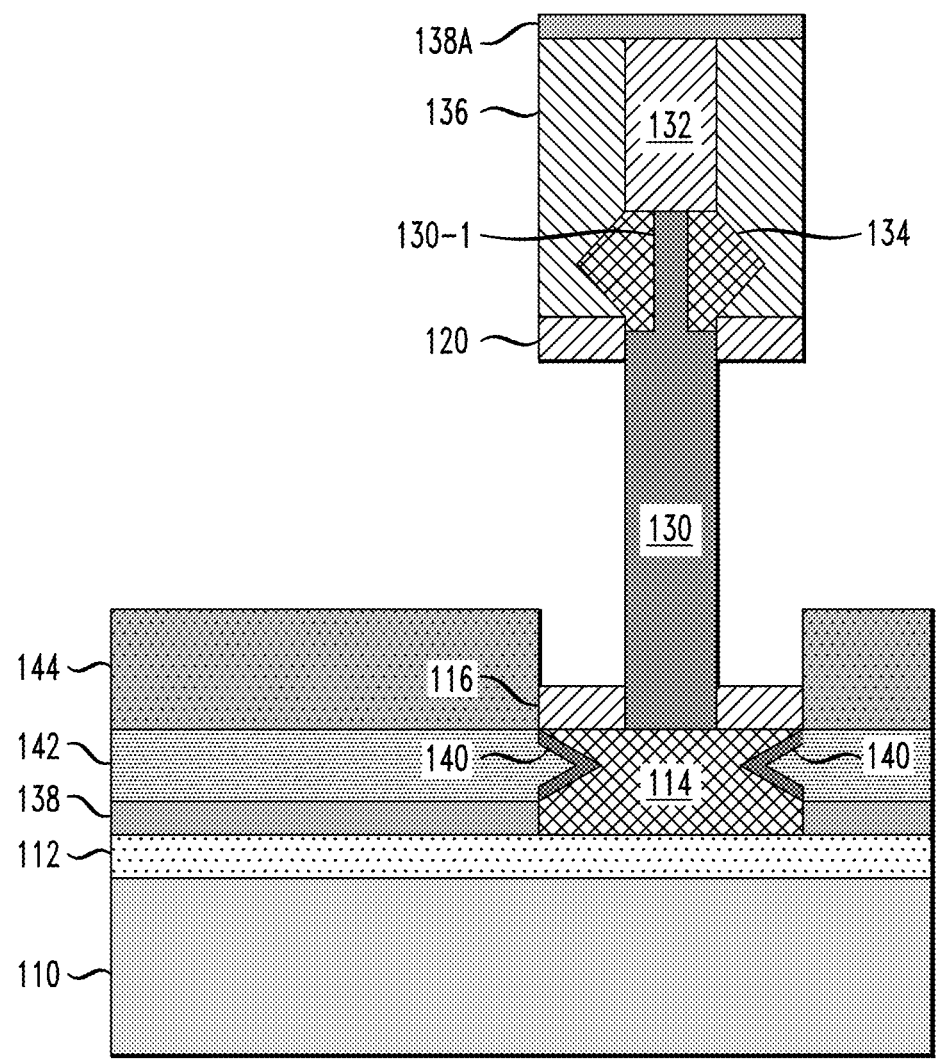

Following formation of the dielectric spacer 144, a next sequence of steps in the exemplary fabrication process, as schematically illustrated in FIGS. 19 through 24, comprise an RMG process flow to replace the dummy gate structure 118 with a metal gate structure (152/150), according to an embodiment of the invention. As an initial step, FIG. 19 is a schematic cross-sectional side view of the semiconductor structure of FIG. 18 after sequentially removing the dummy gate structure 118 and the thin oxide layer 126 to expose the sidewall surfaces of the vertical semiconductor fin 130, according to an embodiment of the invention. With this process, the dummy gate structure 118 is removed using a suitable etch process and etch chemistry to remove the amorphous silicon material of the dummy gate structure 118 selective to the materials of the surrounding structures (e.g., structures 116, 120, 126, 144, etc.). The thin oxide layer 126 serves to protect the sidewall surfaces of the vertical semiconductor fin 130 from being etched during the dummy gate etch. After the dummy gate structure 118 is removed, another etch process is performed to remove the thin oxide layer 126 selective to the surrounding structures (e.g., structures 116, 120, 130, 144, etc.), resulting in the semiconductor structure shown in FIG. 19.

Figure 20:
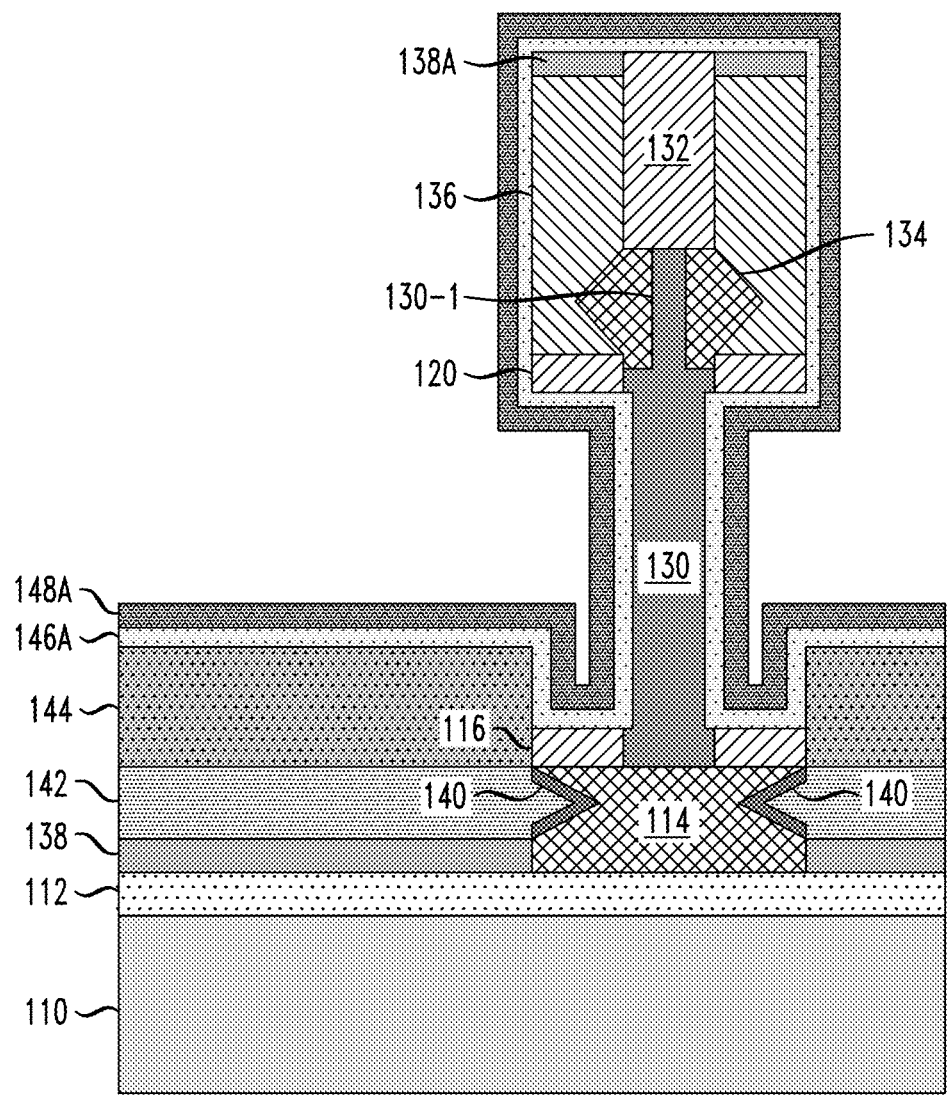

After the removing the dummy gate structure 118 and the thin oxide layer 126, the process continues with sequentially depositing a conformal layer of gate dielectric material and a conformal layer of metallic gate material, which are subsequently patterned to form the high-k metal gate stack structure 150 shown in FIG. 1A. In particular, FIG. 20 is a schematic cross-sectional side view of the semiconductor structure of FIG. 19 after sequentially depositing a thin conformal layer of gate dielectric material 146A and a thin conformal layer of metallic gate material 148A (work function metal) over the semiconductor structure of FIG. 19.

In one embodiment, the conformal layer of gate dielectric material 146A comprises a high-k dielectric material such as, $HfO_2$, $HfSiO_4$, HfSiON, $ZrO_2$, $Al_2O_3$, $TiO_2$, $Ta_2O_5$ $La_2O_3$, $SrTiO_3$, $LaAlO_3$, and combinations thereof. In one embodiment, the conformal layer of dielectric material 146A is deposited with a thickness in a range of about 0.5 nm to about 2.5 nm, which will vary depending on the target application. The conformal layer of dielectric material is deposited using known methods such as ALD, CVD, or PVD, for example.

Further, in one embodiment, the conformal layer of metallic gate material 148A serves as a work function metal (WFM) that may be formed of a metallic material such as Zr, W, Ta, Hf, Ti, Al, Ru, Pa, TaN, TiN, metal oxides, metal carbides, metal nitrides, transition metal aluminides (e.g. $Ti_3Al$, ZrAl), TaC, TiC, TaMgC, or any combination thereof. The type of work function metal that is used will vary depending on whether the vertical FET device is an n-type or p-type device.

Figure 21:
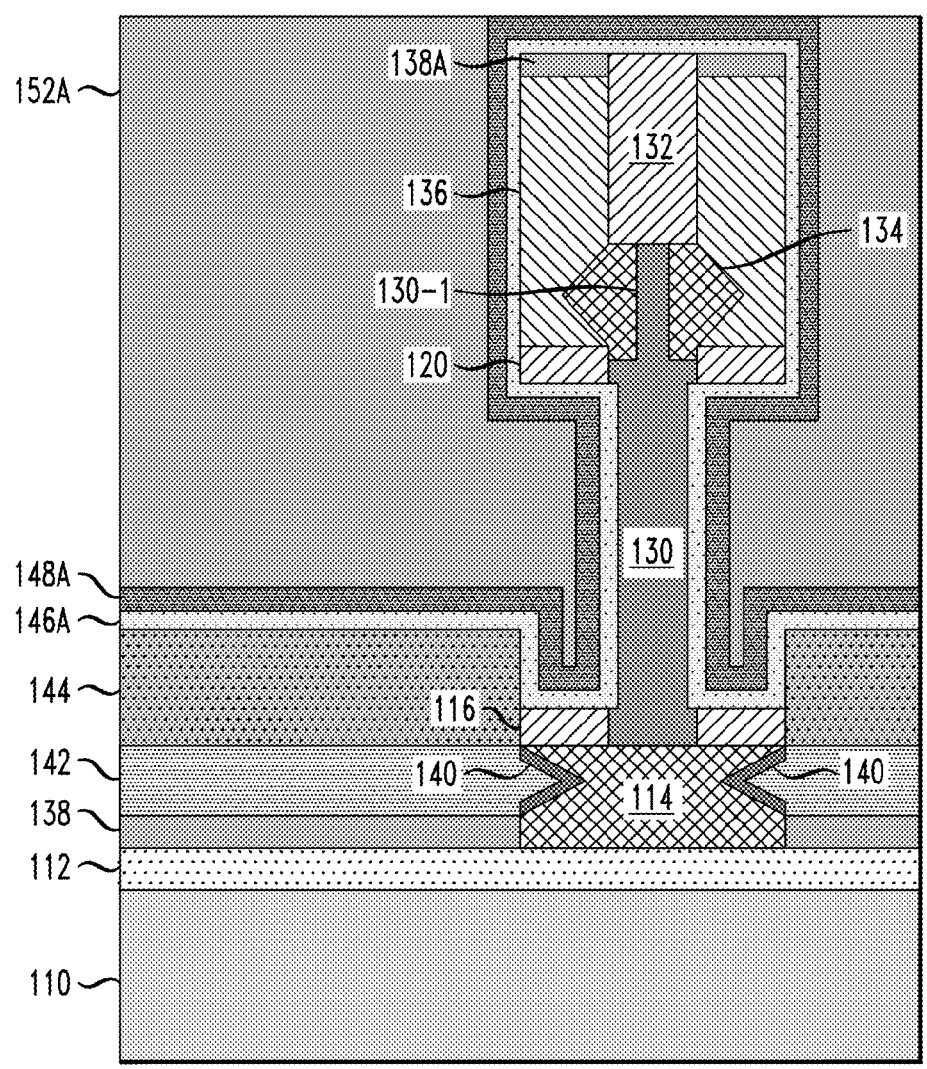

Next, FIG. 21 is a schematic cross-sectional side view of the semiconductor structure of FIG. 20 after depositing and planarizing a layer of gate electrode material 152A, which is subsequently patterned to form the gate electrode 152 shown in FIG. 1A. In one embodiment, the layer of gate electrode material 152A comprises a low-resistance conductive material including, but not limited to tungsten, aluminum, or any metallic or conductive material that is commonly used to form gate electrode structures. The layer of gate electrode material 152A can be deposited by CVD or PE-CVD, and planarized via CMP. As shown in FIG. 21, the layer of gate electrode material 152A is planarized down to the WFM layer 148 on top of the encapsulation structure 136.

Figure 22:
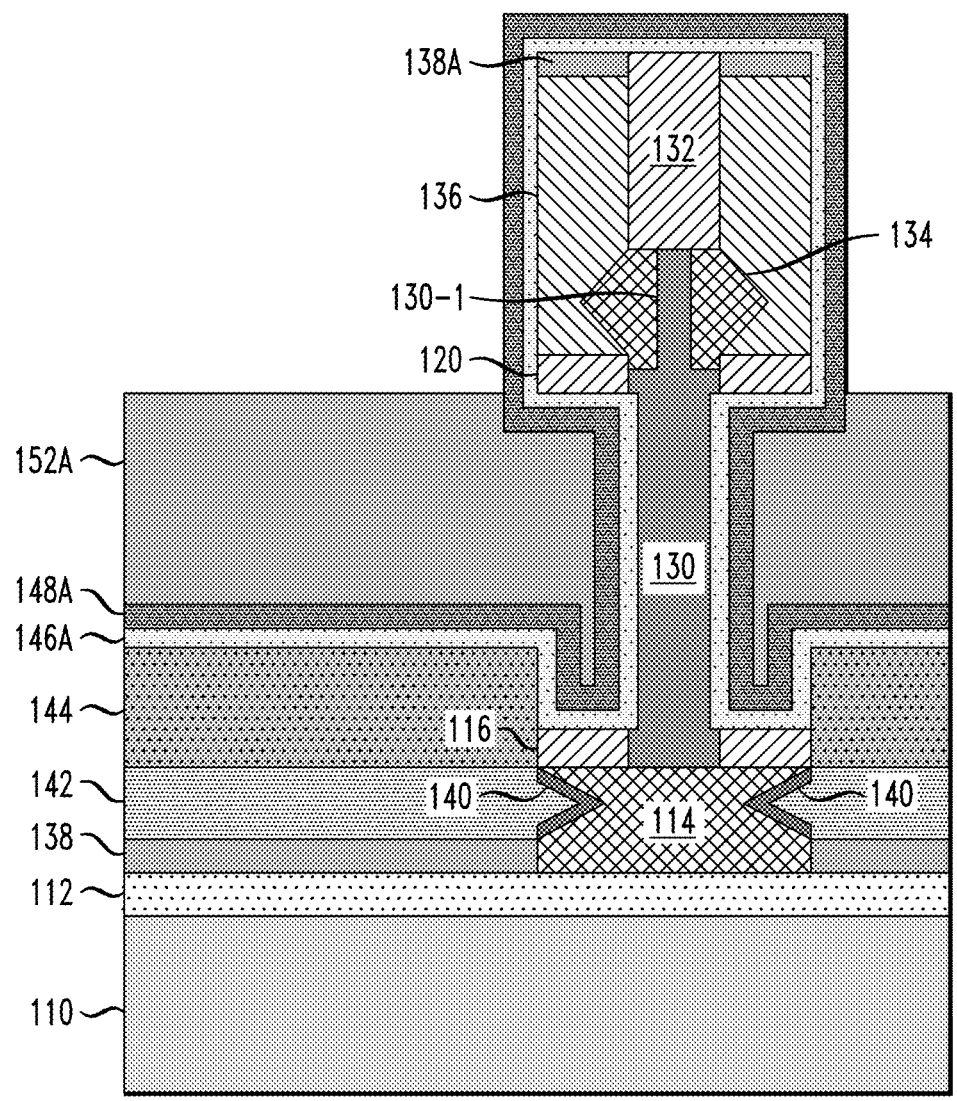

After planarizing the layer of gate electrode material 152A, a next step comprises recessing the layer of gate electrode material 152A down to a target level. For example, FIG. 22 is a schematic cross-sectional side view of the semiconductor structure of FIG. 21 after recessing the layer of gate electrode material 152A down to a target level, which in one embodiment of the invention, is approximately co-planar with a bottom surface of the upper insulating spacer 120, as shown in FIG. 22. The layer of gate electrode material 152A can be recessed using a suitable etch process (e.g., RIE).

Figure 23:
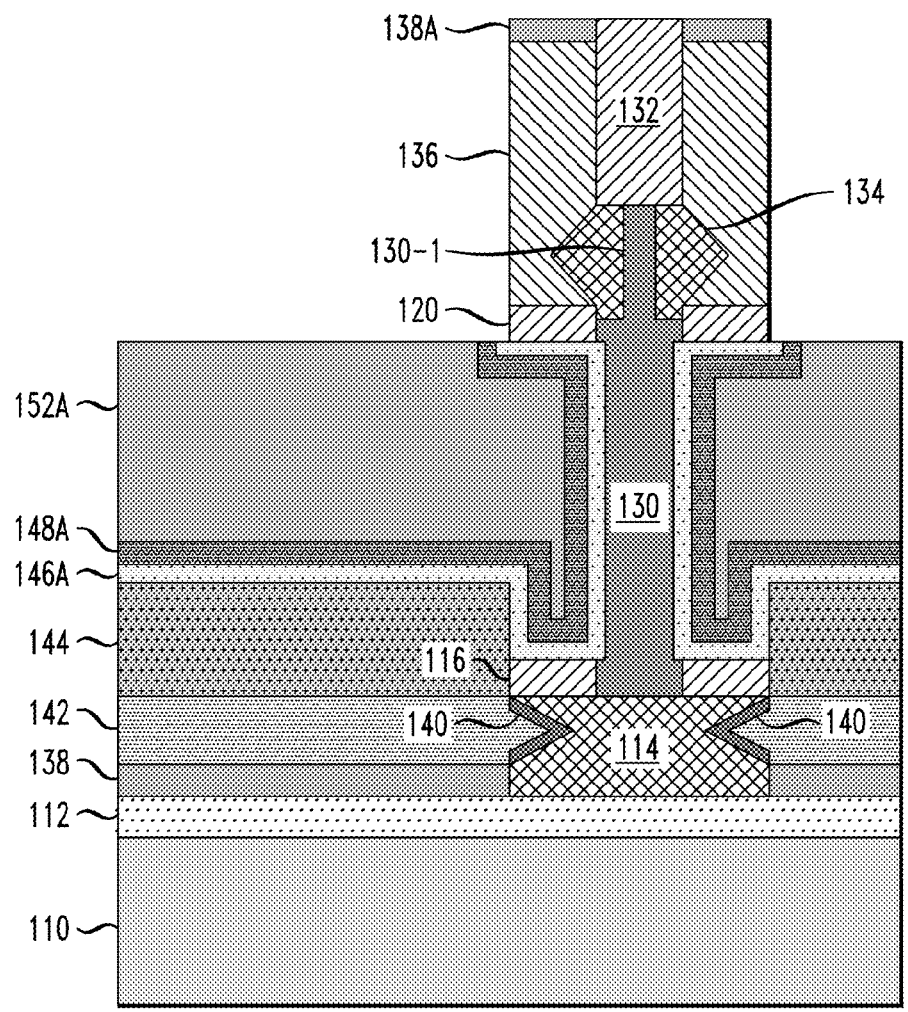
Figure 24:
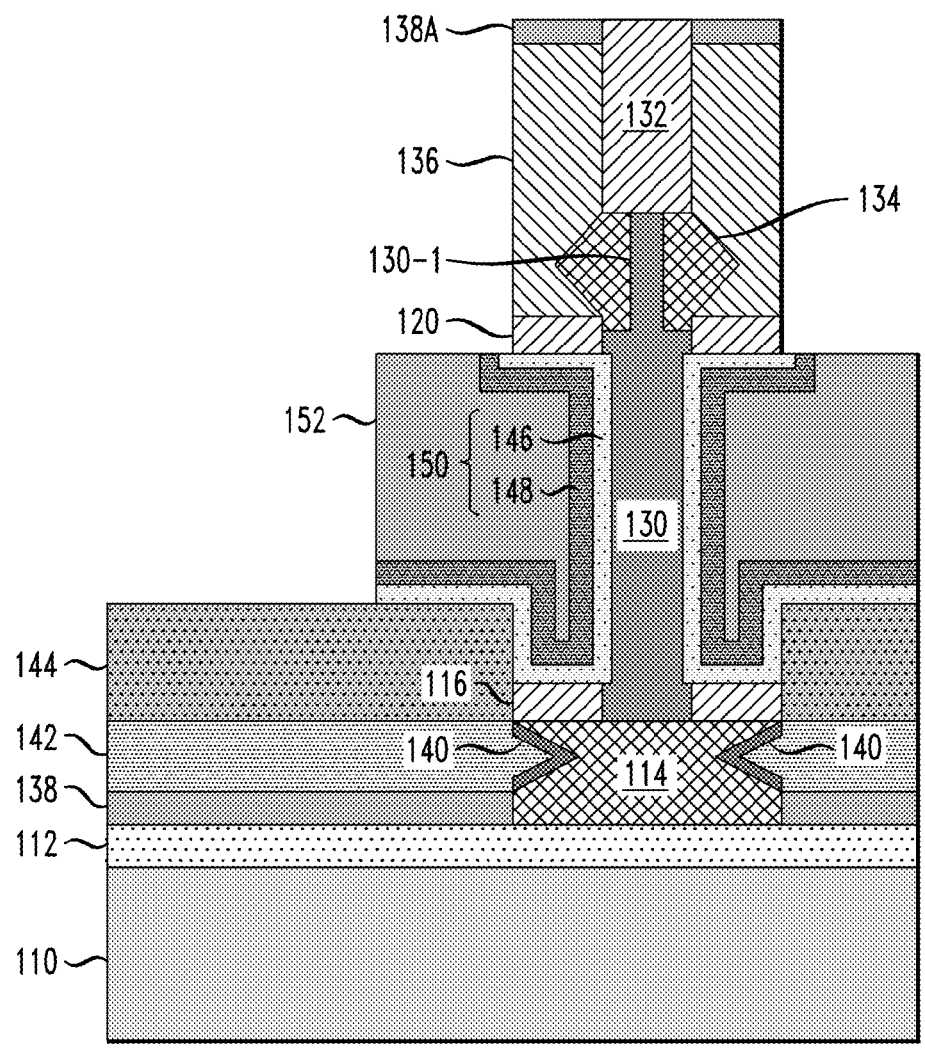

Next, FIG. 23 is a schematic cross-sectional side view of the semiconductor structure of FIG. 22 after removing exposed portions of the conformal layer of gate dielectric material 146A and the conformal layer of metallic gate material 148A on the encapsulation structure 136, which are exposed after recessing the gate electrode material layer 152A. Further, FIG. 24 is a schematic cross-sectional side view of the semiconductor structure of FIG. 23 after performing a gate lithography process to pattern the recessed layer of gate electrode material 152A and the remaining portions of the gate dielectric material layer 146A and the metallic gate material layer 148A to form a metal gate structure (152/150) of the vertical FET device, which comprises the gate electrode 152 and the high-k metal gate structure 150, as shown in FIG. 24.

Figure 25:
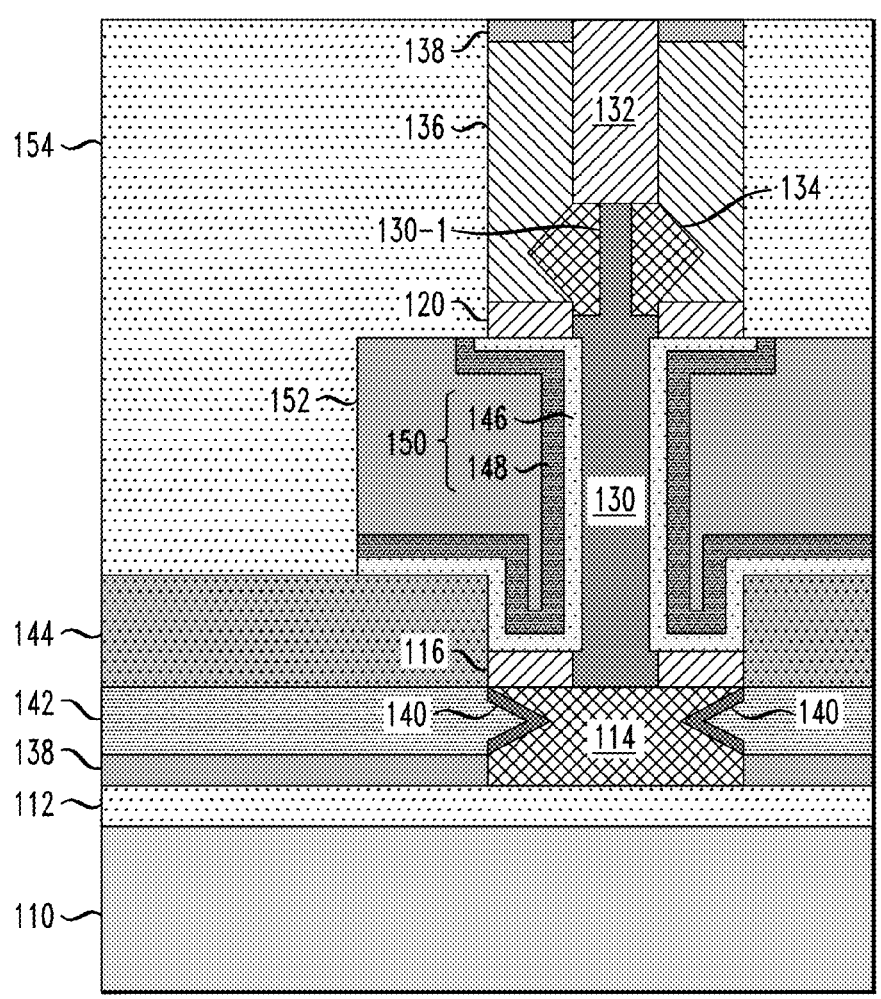

After forming the replacement metal gate structure (gate electrode 152 and the high-k metal gate stack 150) of the vertical FET device, the process flow continues with forming the ILD layer 154 (or what is sometimes referred to as a PMD (pre-metal dielectric) layer) and patterning openings in the ILD layer 154 which are filled with conductive material to form vertical contacts. For example, FIG. 25 is a schematic cross-sectional side view of the semiconductor structure of FIG. 24 after depositing and planarizing a layer of dielectric material to form the ILD layer 154. The ILD layer 154 is formed by depositing a layer of dielectric material over the surface of the semiconductor structure of FIG. 24, and then planarizing the dielectric material down to the remaining oxide layer 138A on the upper surface of the encapsulation structure 136, as shown in FIG. 25. The ILD layer 154 may be formed with any suitable insulating/dielectric materials such as, for example, silicon oxide, silicon nitride, hydrogenated silicon carbon oxide, silicon based low-k dielectrics, porous dielectrics, or organic dielectrics including porous organic dielectrics, etc. The ILD layer 154 may be formed using known deposition techniques, such as, for example, ALD, CVD, PECVD, spin on deposition, or PVD, followed by a standard planarization process (e.g., CMP) to planarize the upper surface of the ILD layer 154.

Figure 26:
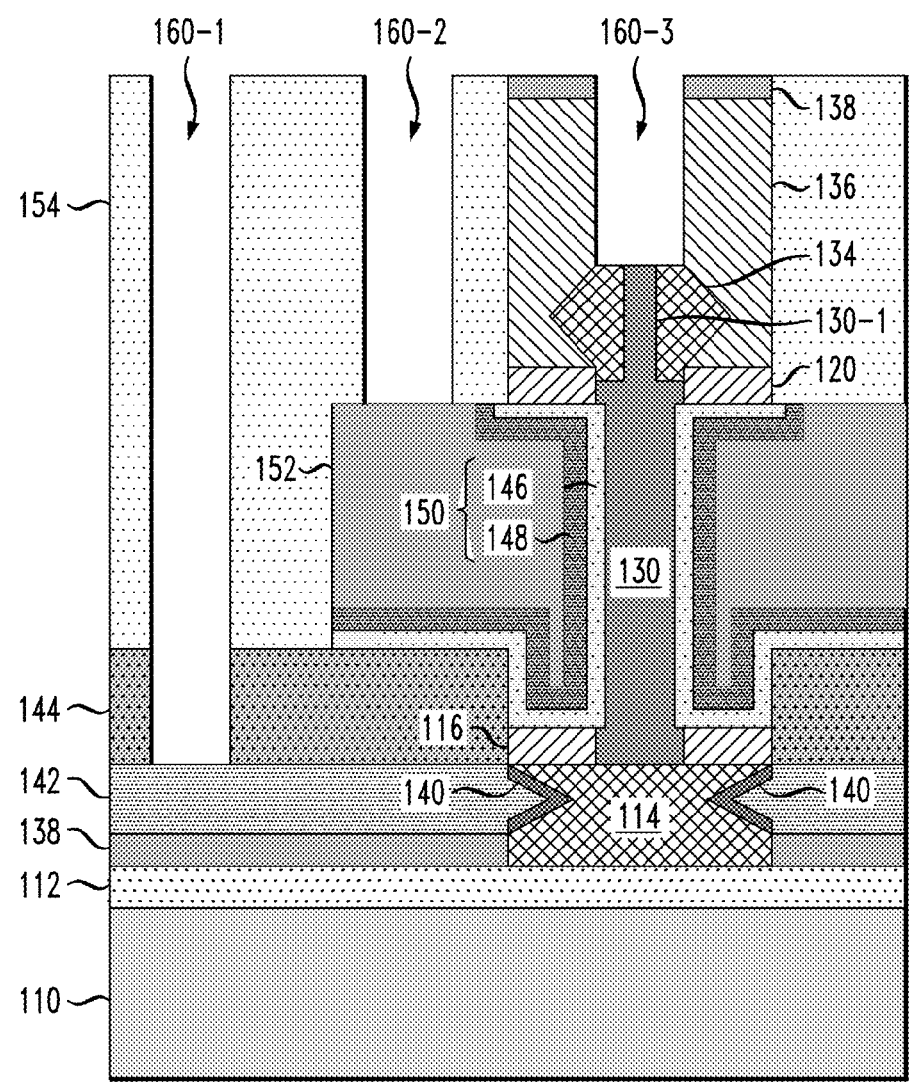

Next, FIG. 26 is a schematic cross-sectional side view of the semiconductor structure of FIG. 25 after etching a pattern of contact openings 160-1, 160-2, and 160-3 which are subsequently filled with conductive material to form the vertical source, drain and gate contacts (e.g., contacts 161, 162 and 163 shown in FIGS. 1A/1B), according to an embodiment of the invention. As shown in FIG. 26, the contact opening 160-1 is formed through the ILD layer 154 and dielectric spacer 144 down to the lower metal contact 142 which wraps around the lower source/drain region 114. The contact opening 160-2 is formed through the ILD layer 154 down to the gate electrode 152. The contact hole 160-3 is etched through the oxide layer 138A and the capping layer 132 down to the upper source/drain region 134. The contact openings 160-1, 160-2, and 160-3 can be formed by a photolithographic process which comprises forming a photoresist layer on the planarized surface of the semiconductor structure shown in FIG. 25, and then pattering (exposing and developing) the photoresist layer to form a photoresist mask having a pattern that corresponds to the pattern of contact openings 160-1, 160-2, and 160-3 that are to be etched in the surface of the semiconductor structure.

After forming the contact openings 160-1, 160-2, and 160-3, the vertical contacts 161, 162, and 163 as shown in FIGS. 1A and 1B are formed by filling the contact openings 160-1, 160-2, and 160-3 with conductive materials using known techniques. For example, a thin conformal liner layer can be initially deposited to line the sidewall surfaces of the contact openings 160-1, 160-2, and 160-3 with a thin conformal barrier diffusion layer (e.g., TiN or TaN, etc.), followed by the deposition of a conductive filler material to fill the contact openings 160-1, 160-2, and 160-3 with conductive material such as copper, tungsten, cobalt, aluminum, or other conductive materials that are suitable for use in forming conductive vertical contacts to the source/drain regions and gate electrodes. Following deposition of the conductive filler material, a CMP process is performed to remove the overburden liner and conductive filler material down to the surface of the ILD layer 154, resulting in the structure shown in FIG. 1A. Thereafter, a standard BEOL (back end of line) process can be performed to form an interconnect network connects the integrated circuit components formed on the active surface of the semiconductor substrate.

In another embodiment of the invention, at the intermediate stage of fabrication shown in FIG. 12, a metal-semiconductor alloy layer can be formed on the exposed vertical sidewalls of the lower source/drain region 114 without performing a sigma etch to form the angled notches 114-1 as shown in FIG. 13. For example, in an alternate process flow, FIG. 27 is a schematic cross-sectional side view of the semiconductor structure of FIG. 12 after forming metal-semiconductor alloy layers 141 on the exposed vertical sidewall surfaces of the lower source/drain region 114, according to another embodiment of the invention. After forming the metal-semiconductor alloy layers 141, the subsequent process flow continues in the same manner as discussed above with reference to FIGS. 15-26 to form a semiconductor device which is similar to the semiconductor device shown in FIGS. 1A/1B, except without the notched sidewalls of the lower source/drain region 114.

It is to be understood that the methods discussed herein for fabricating vertical semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A semiconductor device, comprising:
    a vertical field effect transistor (FET) device formed on a substrate, the vertical FET device comprising a lower source/drain region disposed on the substrate, wherein the lower source/drain region comprises an upper surface, sidewall surfaces, and a bottom surface, wherein the bottom surface of the lower source/drain region contacts the substrate;
    a lower metallic contact disposed adjacent to, and in contact with, at least one sidewall surface of the lower source/drain region, wherein the lower metallic contact comprises a laterally extended portion which laterally extends from the at least one sidewall surface of the lower source/drain region; and
    a vertical source/drain contact which is disposed adjacent to the vertical FET device and which contacts the laterally extended portion of the lower metallic contact;
    wherein the lower source/drain region is not disposed below the lower metallic contact.

2. The semiconductor device of claim 1, wherein the lower metallic contact is disposed adjacent to, and in contact with, all sidewall surfaces of the lower source drain region.

3. The semiconductor device of claim 1, further comprising a metal-semiconductor alloy layer formed on the at least one sidewall surface of the lower source/drain region in contact with the lower metallic contact.

4. The semiconductor device of claim 1, wherein the at least one sidewall surface of the lower source/drain region comprises an etched notch.

5. The semiconductor device of claim 4, further comprising a metal-semiconductor alloy layer formed on angled surfaces of the etched notch.

6. The semiconductor device of claim 1, wherein the substrate comprises a counter-doped semiconductor layer, wherein the bottom surface of the lower source/drain region contacts the counter-doped semiconductor layer, and wherein the semiconductor device further comprises an insulating spacer disposed between the counter-doped semiconductor layer and the lower metallic contact.

7. The semiconductor device of claim 1, wherein the vertical FET device further comprises:
    a vertical semiconductor fin disposed on the upper surface of the lower source/drain region;
    an upper source/drain region connected to an upper surface of the vertical semiconductor fin;
    a gate structure disposed on a sidewall surface of the vertical semiconductor fin;
    an upper spacer to electrically insulate the gate structure from the upper source/drain region; and
    a lower spacer to electrically insulate the gate structure from the lower source/drain region.

8. The semiconductor device of claim 7, wherein the lower source/drain region and the upper source/drain region are formed of doped epitaxial semiconductor material, and wherein the vertical semiconductor fin is epitaxially grown on the upper surface of the lower source/drain region.

9. The semiconductor device of claim 7, further comprising a dielectric spacer disposed between the lower metallic contact and the gate structure.

10. A method of fabricating a semiconductor device, the method comprising:
    forming a vertical field effect transistor (FET) device formed on a substrate, wherein forming the vertical FET device comprises forming a lower source/drain region of the FET device, wherein the lower source/drain region comprises an upper surface, sidewall surfaces, and a bottom surface, wherein the bottom surface of the lower source/drain region contacts the substrate;
    forming a lower metallic contact disposed adjacent to, and in contact with, at least one sidewall surface of the lower source/drain region, wherein the lower metallic contact comprises a laterally extended portion which laterally extends from the at least one sidewall surface of the lower source/drain region; and
    forming a vertical source/drain contact which is disposed adjacent to the vertical FET device and which contacts the laterally extended portion of the lower metallic contact;
    wherein the lower source/drain region is not disposed below the lower metallic contact.

11. The method of claim 10, wherein the lower metallic contact is disposed adjacent to, and in contact with, all sidewall surfaces of the lower source drain region.

12. The method of claim 10, further comprising forming a metal-semiconductor alloy layer on the at least one sidewall surface of the lower source/drain region prior to forming the lower metallic contact.

13. The method of claim 10, further comprising etching a notch in the at least one sidewall surface of the lower source/drain region prior to forming the lower metallic contact.

14. The method of claim 13, further comprising forming a metal-semiconductor alloy layer formed on angled surfaces of the etched notch prior to forming the lower metallic contact.

15. The method of claim 10, wherein the substrate comprises a counter-doped semiconductor layer, wherein the bottom surface of the lower source/drain region contacts the counter-doped semiconductor layer, and wherein the method further comprises forming an insulating spacer on the counter-doped semiconductor layer prior to forming the lower metallic contact, wherein the insulating spacer serves to electrically insulate the lower metallic contact from the counter-doped semiconductor layer.

16. The method of claim 10, wherein forming the vertical FET device further comprises:
  forming a vertical semiconductor fin on the upper surface of the lower source/drain region;
  forming an upper source/drain region connected to an upper surface of the vertical semiconductor fin;
  forming a gate structure disposed on a sidewall surface of the vertical semiconductor fin;
  forming an upper spacer to electrically insulate the gate structure from the upper source/drain region; and
  forming a lower spacer to electrically insulate the gate structure from the lower source/drain region.

17. The method of claim 16, wherein the lower source/drain region and the upper source/drain region are formed of doped epitaxial semiconductor material, and wherein the vertical semiconductor fin is epitaxially grown on the upper surface of the lower source/drain region.

18. The method of claim 16, further comprising forming a dielectric spacer disposed between the lower metallic contact and the gate structure.

19. A semiconductor device formed by a process comprising:
  forming a vertical field effect transistor (FET) device formed on a substrate, wherein forming the vertical FET device comprises forming a lower source/drain region of the FET device, wherein the lower source/drain region comprises an upper surface, sidewall surfaces, and a bottom surface, wherein the bottom surface of the lower source/drain region contacts the substrate;
  forming a lower metallic contact disposed adjacent to, and in contact with, at least one sidewall surface of the lower source/drain region, wherein the lower metallic contact comprises a laterally extended portion which laterally extends from the at least one sidewall surface of the lower source/drain region; and
  forming a vertical source/drain contact which is disposed adjacent to the vertical FET device and which contacts the laterally extended portion of the lower metallic contact;
  wherein the lower source/drain region is not disposed below the lower metallic contact.

20. The semiconductor device of claim 19, wherein the lower metallic contact is disposed adjacent to, and in contact with, all sidewall surfaces of the lower source drain region.

* * * * *